(12) United States Patent
Kwon et al.

(10) Patent No.: US 12,745,450 B2
(45) Date of Patent: Sep. 22, 2026

(54) SEMICONDUCTOR DEVICE WITH CHANNEL STRUCTURES AND IMPURITY REGION STRUCTURES

(71) Applicant: SAMSUNG ELECTRONICS CO., LTD., Suwon-si (KR)

(72) Inventors: Taeyong Kwon, Suwon-si (KR); Yoonjoong Kim, Suwon-si (KR); Seungmin Kim, Suwon-si (KR); Dogeon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 702 days.

(21) Appl. No.: 18/318,587

(22) Filed: May 16, 2023

(65) Prior Publication Data

US 2024/0006411 A1 Jan. 4, 2024

(30) Foreign Application Priority Data

Jul. 1, 2022 (KR) ........................ 10-2022-0081410

(51) Int. Cl.
*H10D 84/00* (2025.01)
*H10D 30/01* (2025.01)
(Continued)

(52) U.S. Cl.
CPC ........... *H10D 84/83* (2025.01); *H10D 30/014* (2025.01); *H10D 30/43* (2025.01);
(Continued)

(58) Field of Classification Search
CPC ............... H10D 84/832; H10D 84/834; H10D 84/83125; H10D 84/8312; H10D 84/013;
(Continued)

(56) References Cited

U.S. PATENT DOCUMENTS 6,566,695 B2 5/2003 Kumashiro
7,332,386 B2 2/2008 Lee et al.
(Continued)

FOREIGN PATENT DOCUMENTS

KR 10-0652381 12/2006

OTHER PUBLICATIONS

Office Action in Korean Appln. No. 10-2022-0081410, mailed on Dec. 18, 2025, 9 pages (with English translation).
Extended European Search Report in European Appln. No. EP 23172714.0, mailed on Feb. 6, 2024, 11 pages.

*Primary Examiner* — Reema Patel
(74) *Attorney, Agent, or Firm* — Fish & Richardson P.C.

(57) ABSTRACT

A semiconductor device may include a plurality of first channel structures on a substrate, a plurality of second channel structures on the substrate, a first impurity region structure between the first channel structures, a second impurity region structure between second channel structures, a third impurity region structure between the first and second channel structures, and a plurality of gate structures disposed between the first to third impurity region structures, respectively.
Each of the first channel structure may have a first width, and each of the second channel structure may have a second width less than the first width. The first impurity region structure may have a first volume, and the second impurity region structure may have a second volume smaller than the first volume. The third impurity region structure may have a third volume smaller than the first volume and greater than the second volume.

20 Claims, 23 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/17*** | (2025.01) |
| ***H10D 84/01*** | (2025.01) |
| ***H10D 84/03*** | (2025.01) |
| ***H10D 84/83*** | (2025.01) |

(52) U.S. Cl.
CPC ....... *H10D 30/6735* (2025.01); *H10D 62/121* (2025.01); *H10D 62/235* (2025.01); *H10D 84/0128* (2025.01); *H10D 84/038* (2025.01)

(58) Field of Classification Search
CPC ........... H10D 84/0133; H10D 30/6735; H10D 62/121
See application file for complete search history.

(56) References Cited

U.S. PATENT DOCUMENTS

| | | | | |
|---|---|---|---|---|
| 7,427,788 | B2 | 9/2008 | Li et al. | |
| 7,939,861 | B2 | 5/2011 | Horch | |
| 9,412,816 | B2 | 8/2016 | Yang et al. | |
| 9,425,251 | B2 | 8/2016 | Kang et al. | |
| 9,634,092 | B2 | 4/2017 | Bhuwalka et al. | |
| 2016/0307837 | A1* | 10/2016 | Park ...................... | H10D 84/83 |
| 2020/0105752 | A1 | 4/2020 | Liaw | |
| 2020/0365692 | A1 | 11/2020 | Jung et al. | |
| 2020/0395470 | A1 | 12/2020 | Kim et al. | |
| 2021/0013321 | A1 | 1/2021 | Yogendra et al. | |
| 2021/0357565 | A1 | 11/2021 | Fang et al. | |

* cited by examiner 170b
104a
104a
104a
192
150b
100
180b
196
198
150b
180c
TR2
TR3a
150c
DB
150a
TR1
181c
181b
181a
150a
180a
FIRST DIRECTION
SECOND DIRECTION 170b
150b
W2
150c
154
150a
170a
W1
VERTICAL DIRECTION
SECOND DIRECTION
FIRST DIRECTION 150b
104a
102a
150c
W2
140a
150a
W1
140b
VERTICAL DIRECTION
SECOND DIRECTION
FIRST DIRECTION 170b
192
104a
104a
104a
150b
100
180b
196
198
150b
TR2
180c
TR3a
150c
DB
150a
180a
TR1
181c
181b
181a
150a
180a
FIRST DIRECTION
SECOND DIRECTION

SEMICONDUCTOR DEVICE WITH CHANNEL STRUCTURES AND IMPURITY REGION STRUCTURES

CROSS-REFERENCE TO RELATED APPLICATION

This application claims priority under 35 USC § 119 to Korean Patent Application No. 10-2022-0081410, filed on Jul. 1, 2022, in the Korean Intellectual Property Office (KIPO), the contents of which are incorporated by reference herein in their entirety.

BACKGROUND

MBC-FETs including a plurality of vertically stacked channels have been developed. The MBC-FETs may be formed to have target electrical characteristics.

SUMMARY

The present disclosure relates to semiconductor devices such as, e.g., semiconductor devices including multi-bridge channel field effect transistors (MBC-FETs) and a having target electrical characteristics. In some implementations, the target electrical characteristics can be achieved by designing impurity region structures of a transistor to have volumes that depend on the width of a tapered fin structure disposed on a side or sides of a gate structure. In some implementations, the transistor can be a medium-frequency transistor that has both electrical characteristics of a high-frequency transistor, e.g., operating in the MHz frequency range, and electrical characteristics of a low-frequency transistor, e.g., operating in the order of Hz, as a result of the transistor's different target electrical characteristics such as, e.g., a size of the source and/or drain regions, on the sides of the gate structure. Thus, in some cases, the transistor can serve as a high-power/low-power buffer based on the different source and drain characteristics.

In general, innovative aspects of the subject matter described in this specification can be embodied in a semiconductor device that includes a plurality of first channel structures on a substrate, a plurality of second channel structures on the substrate, a first impurity region structure between the first channel structures, a second impurity region structure between second channel structures, a third impurity region structure between the first and second channel structures, and a plurality of gate structures disposed between the first to third impurity region structures, respectively. The first channel structures may be spaced apart from each other in a first direction parallel to a surface of the substrate. Each of the first channel structure may have a first width in a second direction parallel to the surface of the substrate and perpendicular to the first direction, and may include silicon patterns spaced apart from each other in a vertical direction. The second channel structures may be spaced apart from each other in the first direction. Each of the second channel structure may have a second width in the second direction less than the first width, and may include silicon patterns spaced apart from each other in the vertical direction. The first impurity region structure may connect sidewalls of adjacent first channel structures, and may have a first volume. The second impurity region structure may connect sidewalls of adjacent second channel structures, and may have a second volume smaller than the first volume. The third impurity region structure may connect sidewalls of adjacent first and second channel structures, and may have a third volume smaller than the first volume and greater than the second volume. Each of the gate structure may cover one of the first and second channel structures, and may extend in the second direction.

In general, in another aspect, the subject matter of the present disclosure can be embodied in a semiconductor device that includes: a first transistor on a substrate, a second transistor on the substrate, and a buffer transistor on the substrate. The first transistor may include a first channel structure having a first width in a second direction parallel to a surface of the substrate, a first gate structure extending in the second direction and parallel to the surface of the substrate to cover the first channel structure, and a first impurity region structure on both sides of the first gate structure in a first direction perpendicular to the second direction. The first impurity region structure may be connected to the first channel structure, and may have a first volume. The second transistor may include a second channel structure having a second width in the second direction less than the first width, a second gate structure extending in the second direction to cover the second channel structure, and a second impurity region structure on both sides of the second gate structure in the first direction. The second impurity region structure may be connected to the second channel structure, and may have a second volume smaller than the first volume. The buffer transistor may include a third channel structure between the first and second transistors, a third gate structure extending in the second direction to cover the third channel structure, a third impurity region structure on a side of the third gate structure in the first direction to be connected with the third channel structure, and a fourth impurity region structure on the other side of the third gate structure to be connected with the third channel structure. The fourth impurity region structure may have a volume different from a volume of the third impurity region structure.

In general, in another aspect, the subject matter of the present disclosure can be embodied in a semiconductor device including: a first transistor and a buffer transistor. The first transistor may include a first channel structure on a substrate, a first gate structure extending in a second direction parallel to the surface of the substrate to cover the first channel structure, and a first impurity region structure on both sides of the first gate structure in a first direction perpendicular to the second direction. The first impurity region structure may be connected to the first channel structure, and may have a first volume. The buffer transistor may include a second channel structure on the substrate, a second gate structure extending in the second direction to cover the second channel structure, and a second impurity region on a side of the second gate structure in the first direction to be connected with the second channel structure. The second impurity region structure may have a second volume different from the first volume of the first impurity region structure. The first impurity region structure may contact on the other side of the second gate structure in the first direction.

In some implementations, the semiconductor device may include the buffer transistor including impurity region structures having different volumes. The buffer transistor may be provided as a transistor that operates with a performance of a middle power that of the first transistor having a high power characteristic and the second transistor having a low power characteristic.

BRIEF DESCRIPTION OF THE DRAWINGS

Example implementations will be more clearly understood from the following detailed description taken in conjunction with the accompanying drawings. FIGS. 1 to 26 represent non-limiting examples as described herein.

FIGS. 1 and 2 are a plan view and a cross-sectional view illustrating examples of semiconductor devices;

FIGS. 3 and 4 are a plan view and a perspective view illustrating an example of an active structure of the semiconductor device;

FIGS. 5A to 7 are perspective views illustrating examples of transistors included in the semiconductor device, respectively;

FIGS. 8 to 22 are plan views, cross-sectional views and perspective views illustrating a method of manufacturing an example of a semiconductor device;

FIGS. 23 to 25 are plan views illustrating examples of semiconductor devices, respectively; and FIG. 26 is a plan view illustrating an example of a semiconductor device.

DETAILED DESCRIPTION

Hereinafter, a direction parallel to a surface of a substrate is referred to as a first direction, and a direction parallel to the surface of the substrate and perpendicular to the first direction is referred to as a second direction. In addition, a direction perpendicular to the surface of the substrate is referred to as a vertical direction.

Figure 1:
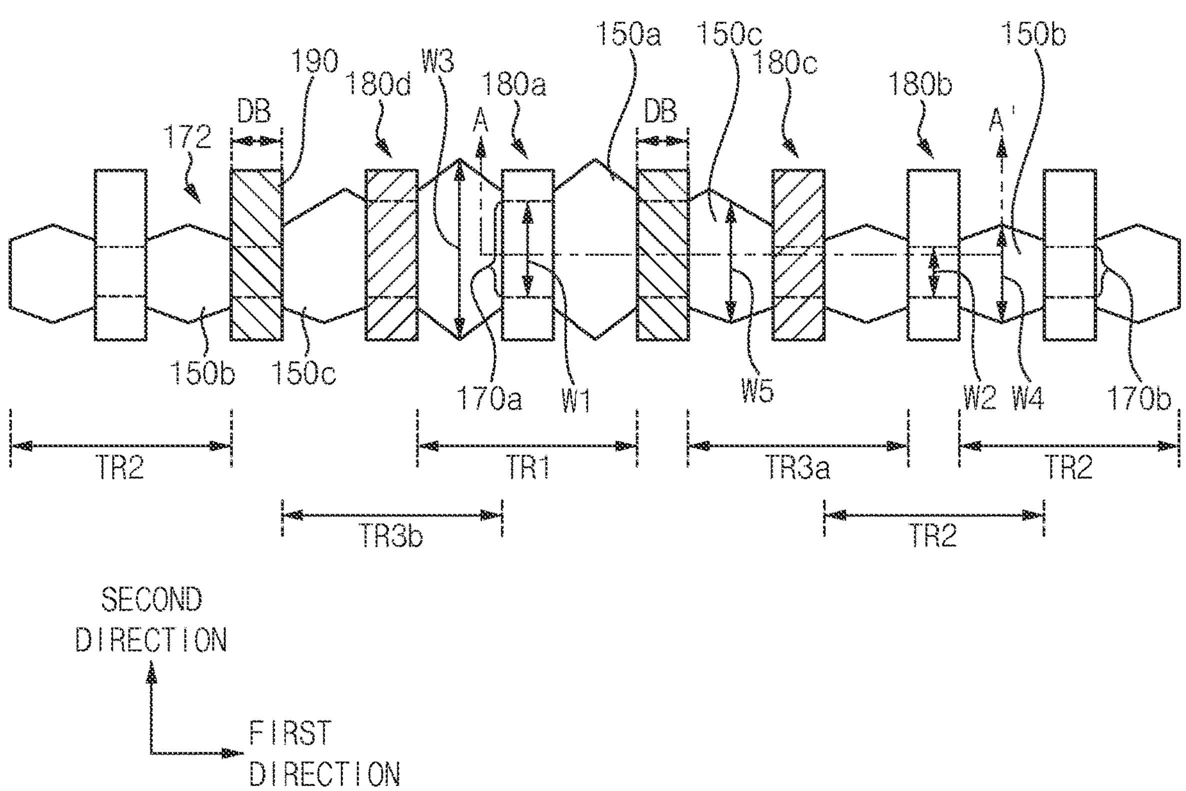
Figure 2:
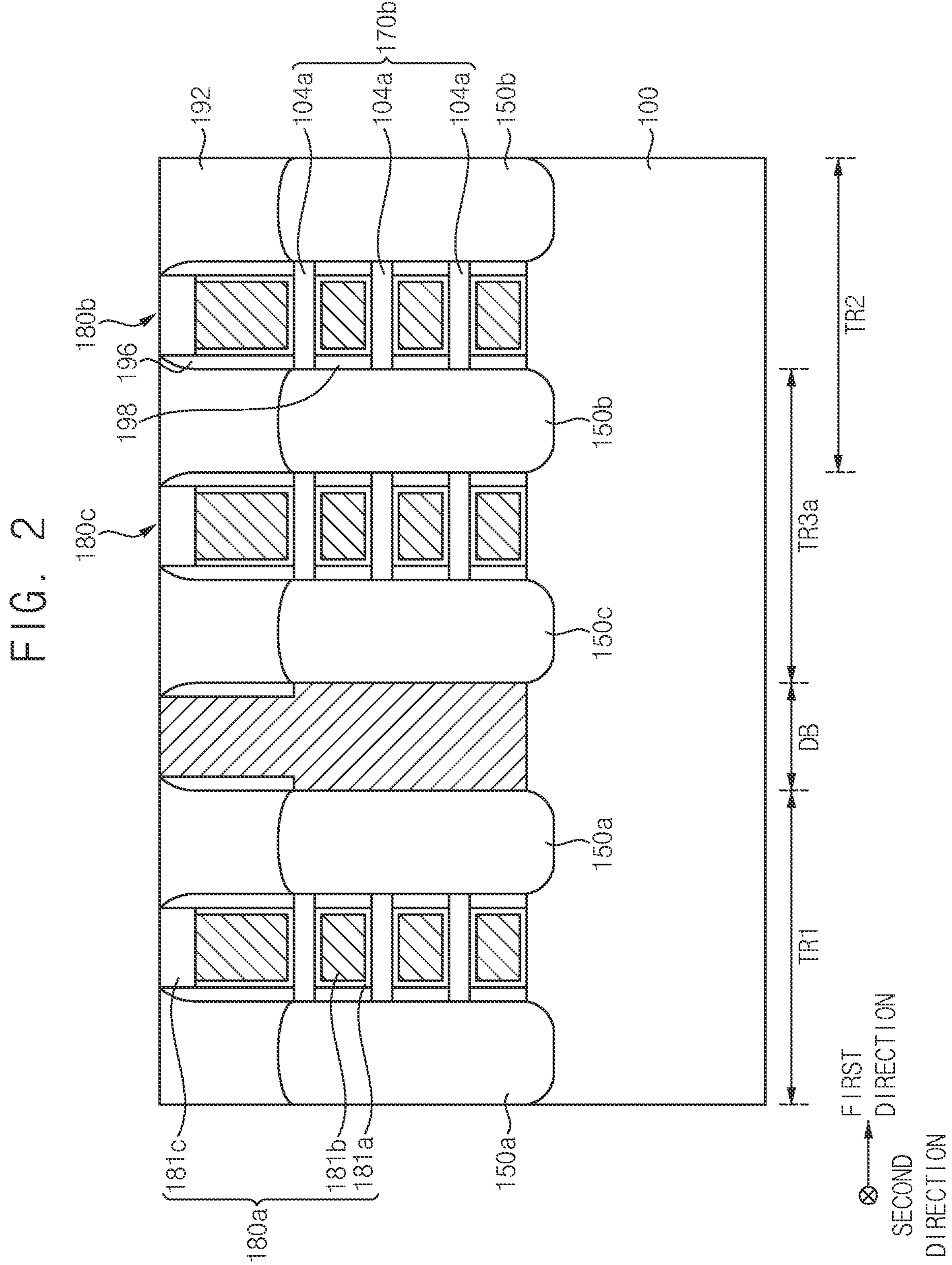
Figure 3:
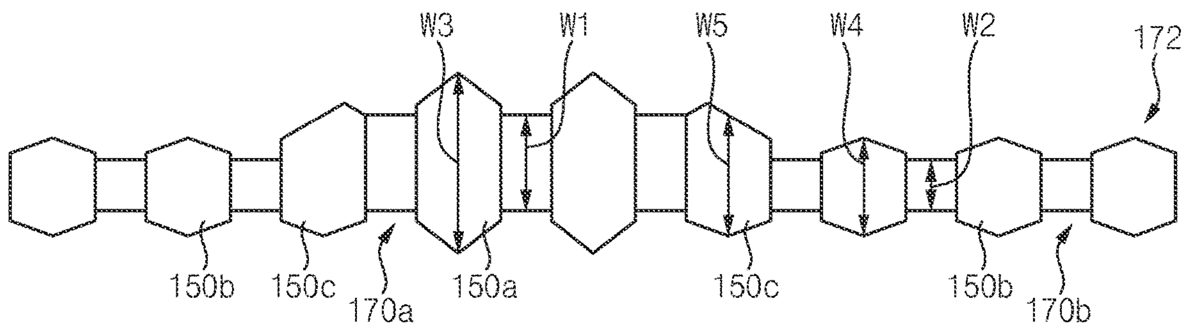
Figure 3:
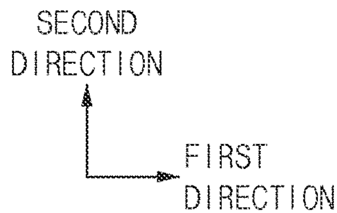
Figure 4:
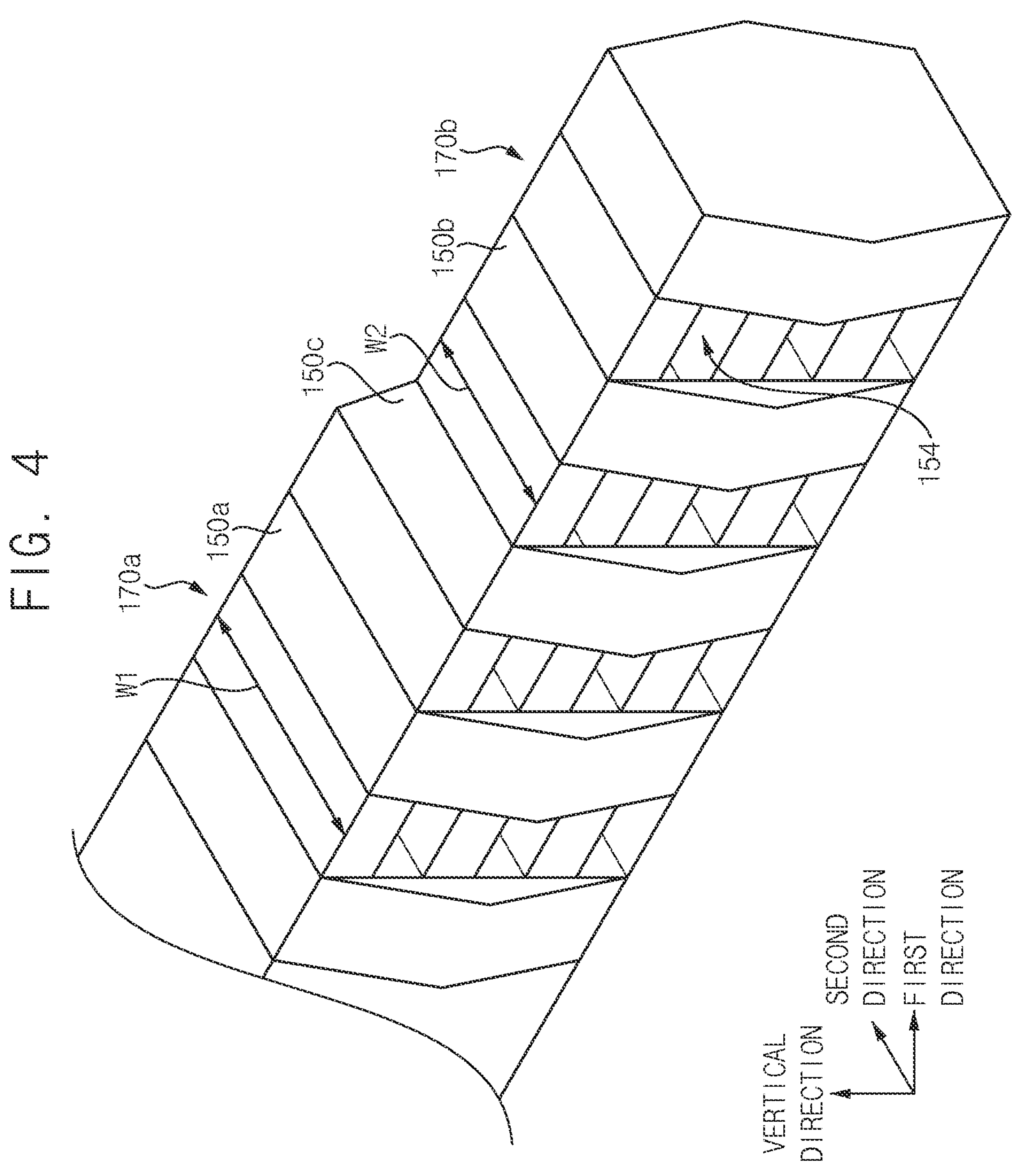

FIGS. 1 and 2 are a plan view and a cross-sectional view illustrating an example of a semiconductor device. FIGS. 3 and 4 are a plan view and a perspective view illustrating an example of an active structure of the semiconductor device. FIGS. 5A to 7 are perspective views illustrating examples of transistors included in the semiconductor device.

Figure 5A:
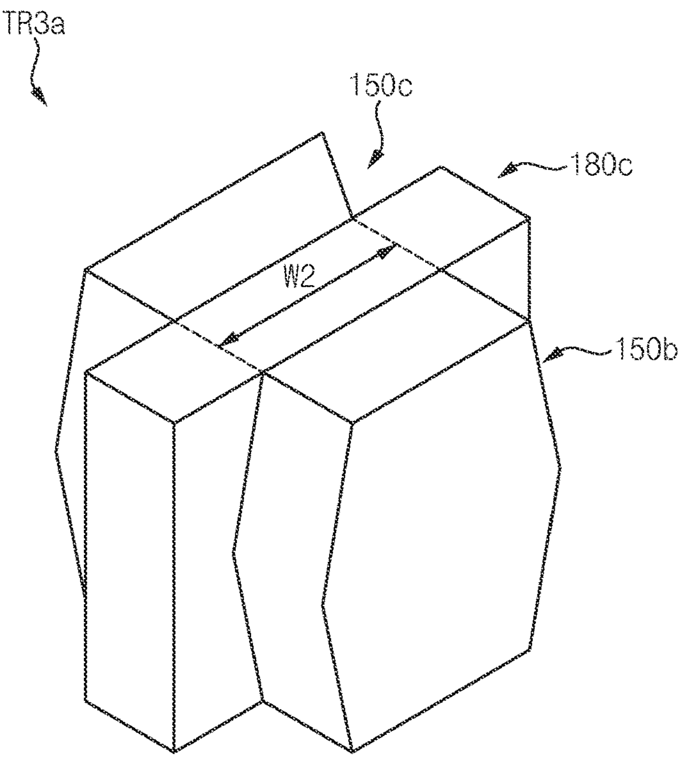
Figure 5B:
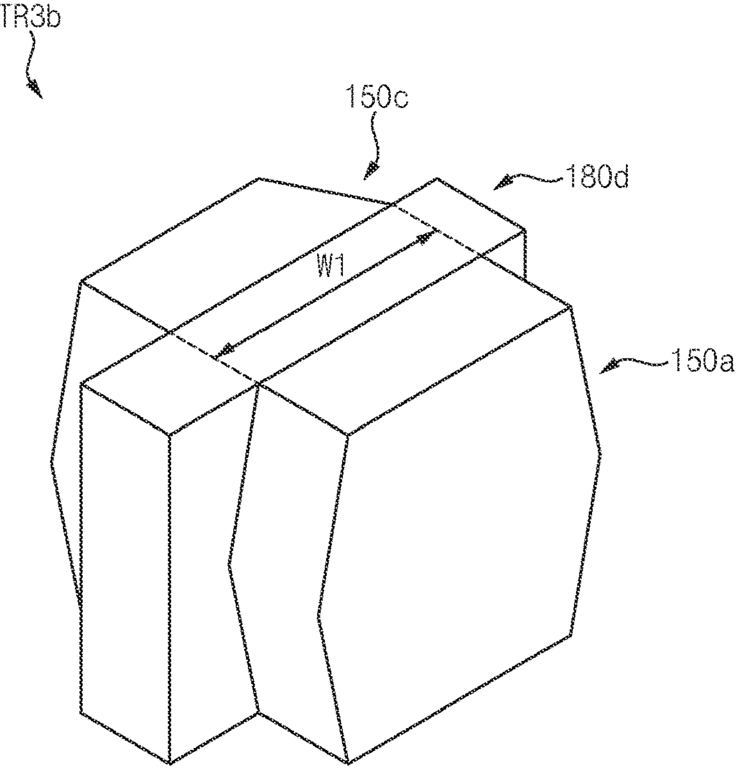
Figure 6:
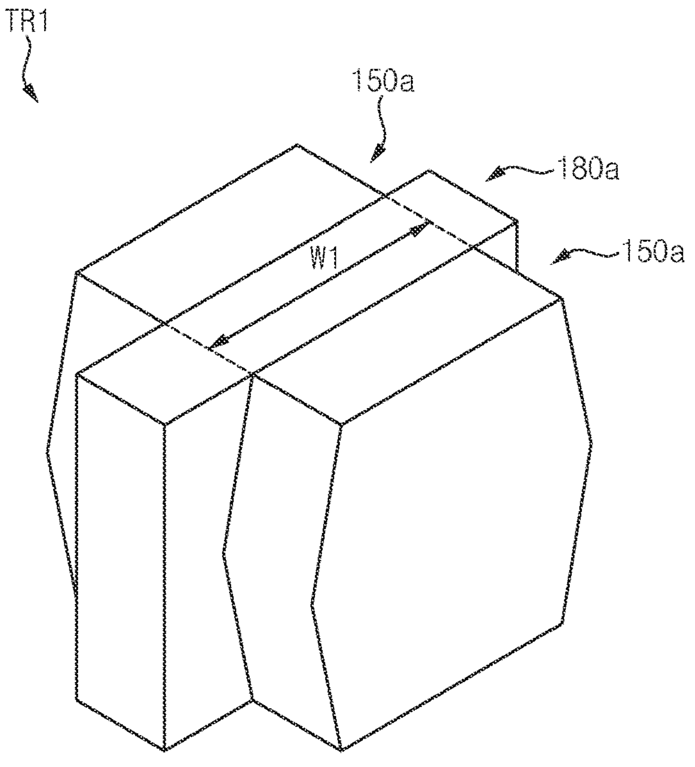
Figure 7:
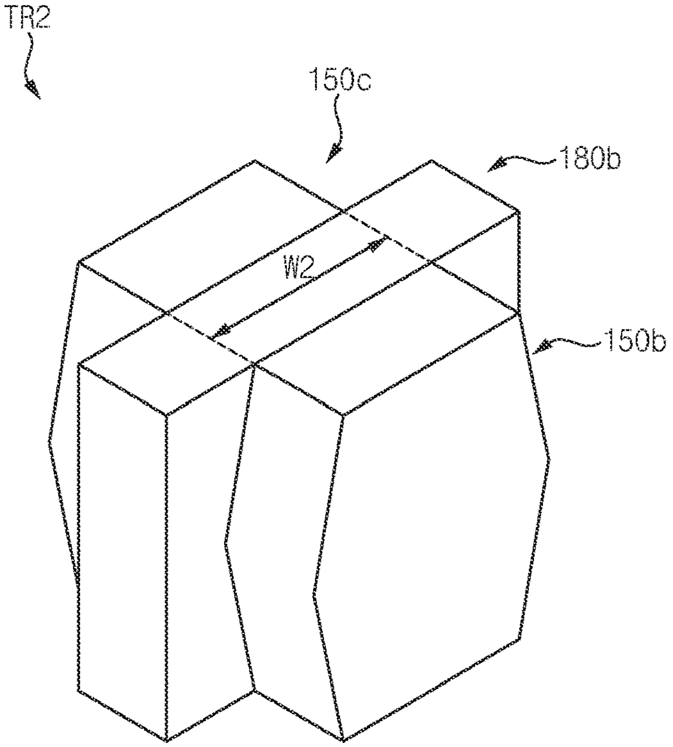

FIG. 2 is a cross-sectional view taken along line A-A' of FIG. 1. FIGS. 5A and 5B show first and second buffer multi-bridge channel transistors, respectively. FIG. 6 shows a first multi-bridge channel transistor, and FIG. 7 shows a second multi-bridge channel transistor.

Referring to FIGS. 1 to 7, the semiconductor device may include first multi-bridge channel transistors TR1, second multi-bridge channel transistors TR2, and buffer multi-bridge channel transistors TR3*a* and TR3*b* formed in an active structure 172.

The active structure 172 may be formed on a substrate 100 of an active region. The active structure 172 may extend in the first direction. The active structure 172 may include a single crystal semiconductor material.

The active structure 172 includes channel structures 170*a* and 170*b* spaced apart from each other and impurity region structures 150*a*, 150*b*, and 150*c* between the channel structures 170*a* and 170*b*. The impurity region structures 150*a*, 150*b*, and 150*c* may contact both sidewalls of the channel structures 170*a* and 170*b* in the first direction, and may be connected with adjacent channel structures 170*a* and 170*b*. In the active structure, the channel structures 170*a* and 170*b* and the impurity region structures 150*a*, 150*b*, and 150*c* may be alternately and repeatedly arranged in the first direction.

The active structure 172A may include plurality of channel structures 170*a* and 170*b* having different widths in the second direction. In some implementations, the channel structures 170*a* and 170*b* may include first channel structures 170*a* having a first width W1 in the second direction and second channel structures 170*b* having a second width W2 less than the first width W1 in the second direction. In a plan view, the first channel structures 170*a* may be spaced apart from each other in the first direction, and may be arranged in parallel. In the plan view, the second channel structures 170*b* may be spaced apart from each other in the first direction and may be arranged in parallel. An interval (i.e., spacing) between the first channel structures 170*a* in the first direction may be substantially the same. In addition, intervals between the second channel structures 170*b* in the first direction may be substantially the same.

In some implementations, the channel structures 170*a* and 170*b* may have the same width in the first direction.

Referring to FIGS. 2 to 4, the channel structures 170*a* and 170*b* may have a stacked structure in which first silicon patterns 104*a* are vertically spaced apart from each other. A gap may be formed between the silicon patterns 104*a*. The first silicon pattern 104*a* may include single crystal silicon.

In the active structure 172, the impurity region structures 150*a*, 150*b*, and 150*c* may include a first impurity region structure 150*a*, a second impurity region structure 150*b* and a third impurity region structure 150*c*. The first impurity region structure 150*a* may be disposed between the first channel structures 170*a*, and the second impurity region structure 150*b* may be disposed between the second channel structures 170*b*. The third impurity region structure 150*c* may be disposed between the first channel structure 170*a* and the second channel structure 170*b*.

The impurity region structures 150*a*, 150*b* and 150*c* may include a semiconductor material. In some implementations, each of the impurity region structures 150*a*, 150*b* and 150*c* may include single crystal silicon. In some implementations, each of the impurity region structures 150*a*, 150*b* and 150*c* may include single crystal silicon germanium.

In the cross-sectional view, each of the impurity region structures 150*a*, 150*b*, and 150*c* may contact sidewalls of silicon patterns 104*a* vertically disposed in the channel structures 170*a* and 170*b*, and may be connected with the adjacent channel structures 170*a* and 170*b*.

Each of the first, second and third impurity region structures 150*a*, 150*b*, and 150*c* may be formed by selective epitaxial growth from a first active fin protruding from the substrate. The first active fin may have a first portion, a second portion and a third portion. The first portion may have the first width in the second direction, and both sidewalls of the first portion in the second direction may have a line shape. The second portion may have the second width less than the first width in the second direction, and both sidewalls of the second portion in the direction may have a line shape. The third portion may be positioned between the first and second portions, and at least one sidewall of the third portion in the second direction may have a tapered shape.

In some implementations, first sidewalls of the first to third portions in the second direction may have a straight line shape extending in the first direction. A second sidewall of the third portion in the second direction may have the tapered shape.

The first impurity region structure 150*a* may be formed by growing from the first portion by a selective epitaxial growth process. The second impurity region structure 150*b* may be formed by growing from the second portion by a selective epitaxial growth process. The third impurity region structure 150*c* may be formed by growing from the third portion by a selective epitaxial growth process.

A maximum width of the first impurity region structure 150*a* in the second direction may have a third width W3 greater than the first width W1. In the plan view, the first impurity region structures 150*a* may have the same first size. The first impurity region structures 150*a* may have the same first volume. In some implementations, in the plan view, the first impurity region structure 150*a* may be symmetrical to each other with respect to a straight line passing through a center thereof in the first direction. In the plan view, the first impurity region structure 150*a* may be symmetrical to each other with respect to a straight line passing through a center thereof in the second direction.

A maximum width of the second impurity region structure 150*b* in the second direction may have a fourth width W4. The fourth width W4 may be greater than the second width W2, and may be less than the third width W3. In the plan view, the second impurity region structures 150*b* may have a second size smaller than the first size. The second impurity region structures 150*b* may have a second volume smaller than the first volume.

In some implementations, in the plan view, the second impurity region structure 150*b* may be symmetrical to each other with respect to a straight line passing through a center thereof in the first direction. In the plan view, the second impurity region structure 150*b* may be symmetrical to each other with respect to a straight line passing through a center thereof in the second direction.

A maximum width of the third impurity region structure 150*c* in the second direction may have a fifth width W5. The fifth width W5 may be greater than the fourth width W4, and may be less than the third width W3. In the plan view, the third impurity region structures 150*c* may have a third size smaller than the first size and greater than the second size. The third impurity region structures 150*c* may have a third volume smaller than the first volume and greater than the second volume.

In some implementations, in the plan view, the third impurity region structure 150*c* may be asymmetrical to each other with respect to a straight line passing through a center thereof in the first direction. In the plan view, the third impurity region structure 150*c* may be asymmetrical to each other with respect to a straight line passing through a center thereof in the second direction. In the plan view, in the third impurity region structure 150*b*, a portion grown from the tapered second sidewall of the third portion in the first active fin may have a shape different from a shape of a portion grown from the liner first sidewall of the third portion in the first active fin.

In each of the first to third impurity region structures 150*a*, 150*b* and 150*c*, lengths in the second direction of uppermost flat surfaces in the first to third impurity region structures 150*a*, 150*b* and 150*c* may be different from each other. As the width of the impurity region structure in the second direction increases, the length of the uppermost flat surface may increase. Accordingly, the length of the flat surface of the first impurity region structure 150*a* may be the longest and the length of the flat surface of the second impurity region structure 150*b* may be the shortest.

The impurity region structures 150*a*, 150*b* and 150*c* may include a single crystal silicon material. In some implementations, the impurity region structures 150*a*, 150*b* and 150*c* may include silicon or silicon germanium. The impurity region structure 150*a*, 150*b* and 150*c* may be doped with impurities. The impurity region structures 150*a*, 150*b*, and 150*c* may serve as source/drain regions of the multi-bridge channel transistors.

In a cross-sectional view cut in the second direction, each of the impurity region structures 150*a*, 150*b*, and 150*c* may have a polygonal shape (e.g., a pentagon, a hexagon, or a partial of a quadrangle) in which a central portion protrudes. The first impurity region structure 150*a* may protrude from sidewalls of adjacent first channel structure 170*a* in the second direction. The second impurity region structure 150*b* may protrude from sidewalls of adjacent second channel structure 170*b* in the second direction. The third impurity region structure 150*c* may protrude from sidewalls of each of the adjacent first and second channel structures 170*a* and 170*b* in the second direction. The maximum width in the second direction of each of the impurity region structures 150*a*, 150*b*, and 150*c* may be greater than the width in the second direction of the channel structures 170*a* and 170*b* adjacent to each of the impurity region structures 150*a*, 150*b*, and 150*c*. In some implementations, each of the first to third impurity region structures 150*a*, 150*b*, and 150*c* may have the same width in the first direction.

Gate structures 180*a*, 180*b*, 180*c*, and 180*d* may extend in the second direction while surrounding each of the channel structures 170*a* and 170*b*. The gate structures 180*a*, 180*b*, 180*c* and 180*d* may serve as gates of the multi-bridge channel transistors. Each of the gate structures 180*a*, 180*b*, 180*c* and 180*d* may include an interface pattern (not shown), a gate insulation pattern 181*a*, a gate electrode 181*b*, and a capping pattern 181*c*. Each of the gate structures 180*a*, 180*b*, 180*c* and 180*d* may cover surfaces of the channel structures 170*a* and 170*b*, and may fill the gap included in the each of channel structures 170*a* and 170*b*.

In some implementations, each of the gate structures 180*a*, 180*b*, 180*c* and 180*d* may have the same width in the first direction.

In some implementations, spacers (referred to FIG. 2, 196) may be further formed on upper sidewalls of the gate structures 180*a*, 180*b*, 180*c* and 180*d*. In some implementations, inner spacers (referred to FIG. 2, 198) may be further formed on both sidewalls of the gate structures 180*a*, 180*b*, 180*c* and 180*d* formed in the gaps included in each of the channel structures 170*a* and 170*b*.

As the gate structures 180*a*, 180*b*, 180*c*, and 180*d* are formed on the active structure 172, the first multi-bridge channel transistors TR1, the second multi-bridge channel transistor TR2 and buffer multi-bridge channel transistors TR3*a* and TR3*b*, e.g., buffer transistors, may be formed on the active structure 172.

In some implementations, the active structure 172 may further include a diffusion break region (DB) for electrically isolating the multi-bridge channel transistors. The diffusion break region DB may be positioned between adjacent impurity region structures. A separation pattern 190 may be formed in the diffusion break region DB. The separation pattern 190 may include an insulation material, e.g., silicon oxide, silicon nitride, or the like.

The first multi-bridge channel transistors TR1, the second multi-bridge channel transistors TR2 and the buffer multi-bridge channel transistors TR3*a* and TR3*b* may be arranged in the first direction, and may be connected in series in the first direction to be shared source/drains region with each other.

As shown in FIG. 6, the first multi-bridge channel transistor TR1 may be a high-power transistor having high performance. The first multi-bridge channel transistor TR1 may include a first gate structure 180*a* and the first impurity region structures 150*a* adjacent to both sides of the first gate structure 180*a*. The first impurity region structures 150*a* may serve as first source/drain regions of the first multi-bridge channel transistor TR1. Since the first impurity region structures 150*a* have the first volume, the first source/drain regions may have the same first volume. The first gate structure 180*a* may extend in the second direction while surrounding the first channel structure 170*a* disposed between the first impurity region structures 150*a*. In the first multi-bridge channel transistor TR1, a width of a channel may have the first width, and the first source/drain regions may have the first volume. Therefore, on-currents during operation of the first multi-bridge channel transistor TR1 may be increased, and the first multi-bridge channel transistor TR1 may have high operation speed.

As shown in FIG. 7, the second multi-bridge channel transistor TR2 may be a low-power transistor having lower performance than that of the first multi-bridge channel transistor TR1. The second multi-bridge channel transistor TR2 may include a second gate structure 180*b* and the second impurity region structures 150*b* adjacent to both sides of the second gate structure. The second impurity region structures 150*b* may serve as second source/drain regions of the second multi-bridge channel transistor TR2. Since the second impurity region structures 150*b* have the second volume smaller than the first volume, the second source/drain regions may have the same second volume. The second gate structure 180*b* may extend in the second direction while surrounding the second channel structure 170*b* disposed between the second impurity region structures 150*b*. In the second multi-bridge channel transistor TR2, a width of the channel may have the second width less than the first width. Since the second multi-bridge channel transistor TR2 has a width of a channel less than the width of the channel of the first multi-bridge channel transistor TR1 and the volume of the second source/drain regions smaller than the volume of the first source/drain regions in the first multi-bridge channel transistor TR1, on currents during operation of the second multi-bridge channel transistor TR2 may be decreased and the operation speed thereof may be low.

The buffer multi-bridge channel transistors TR3*a* and TR3*b* may operate with an intermediate performance of the first and second multi-bridge channel transistors TR1 and TR2. The buffer multi-bridge channel transistors TR3*a* and TR3*b* may be electrically connected to at least one of the first multi-bridge channel transistor TR1 and the second multi-bridge channel transistor TR2.

In some implementations, the buffer multi-bridge channel transistors TR3*a* and TR3*b* may include a plurality of transistors having different electrical characteristics. For example, the buffer multi-bridge channel transistors TR3*a* and TR3*b* may include a first buffer multi-bridge channel transistor TR3*a* and a second buffer multi-bridge channel transistor TR3*b*.

As shown in FIG. 5A, the first buffer multi-bridge channel transistor TR3*a* may include a third gate structure 180*c*, a third impurity region structure 150*c* adjacent to one side of the third gate structure 180*c* and the second impurity region structure 150*b* adjacent to the other side of the third gate structure 180*c*. The third gate structure 180*c* can serve as a gate to the to the first buffer multi-bridge channel transistor TR3. The third impurity region structure 150*c* may serve as a third source region of the first buffer multi-bridge channel transistor TR3*a*. The second impurity region structure 150*b* may serve as a third drain region of the first buffer multi-bridge channel transistor TR3*a*. The second impurity region structure 150*b* may be shared with the first buffer multi-bridge channel transistor TR3*a* and the second multi-bridge channel transistor TR2, and the second impurity region structure 150*b* may serve as a common impurity region. The first buffer multi-bridge channel transistor TR3*a* may be electrically connected to the second multi-bridge channel transistor TR2.

Therefore, the third source region may have the third volume smaller than the first volume and greater than the second volume, and the third drain region may have the second volume. In the first buffer multi-bridge channel transistor TR3*a*, the third source region and the third drain region may have different volumes.

The third gate structure 180*c* may extend in the second direction while surrounding the second channel structure 170*b* disposed between the third source/drain regions. As the third gate structure 180*c* overlaps the second channel structure 170*b*, the channel of the first buffer multi-bridge transistor TR3*a* may have the second width W2 in the second direction.

In this case, the width in the second direction of the second channel structure 170*b* overlapping the third gate structure 180*c* may not vary depending on positions of the second channel structure 170*b*. Since the width in the second direction of the channel of the first buffer multi-bridge transistor TR3*a* does not vary according to the positions of the channel, variation of electrical characteristics generated as the width of the channel in the second direction is changed may not occur.

As shown in FIG. 5B, the second buffer multi-bridge channel transistor TR3*b* may include a fourth gate structure 180*d*, the third impurity region structure 150*c* adjacent to one side of the fourth gate structure 180*d* and the first impurity region structure 150*a* adjacent to the other side of the fourth gate structure 180*d*. The fourth gate structure 180*d* can serve as a gate to the to the second buffer multi-bridge channel transistor TR3*b*. The third impurity region structure 150*c* may serve as a fourth source region of the second buffer multi-bridge channel transistor TR3*b*. The first impurity region structure 150*a* may serve as a fourth drain region of the second buffer multi-bridge channel transistor TR3*b*. The first impurity region structure 150*a* may be shared with the second buffer multi-bridge channel transistor TR3*b* and the first multi-bridge channel transistor TR1, and may serve as a common impurity region. The second buffer multi-bridge channel transistor TR3*b* may be electrically connected to the first multi-bridge channel transistor TR1.

Therefore, the fourth source region may have the third volume smaller than the first volume and greater than the second volume. The fourth drain region may have the first volume. In the second buffer multi-bridge channel transistor TR3*b*, the fourth source region and the fourth drain region may have different volumes.

Since the volume of the fourth drain region of the second buffer multi-bridge channel transistor TR3*b* is greater than that of the third drain region of the first buffer multi-bridge channel transistor TR3*a*, the second buffer multi-bridge channel transistor TR3*b* may have a performance higher than a performance of the first buffer multi-bridge channel transistor TR3*a*.

The fourth gate structure 180*d* may extend in the second direction while surrounding the first channel structure 170*a* disposed between the fourth source/drain regions. As the fourth gate structure 180*d* overlaps the first channel structure 170*a*, the channel of the second buffer multi-bridge transistor TR3*a* may have the first width W1 in the second direction greater than the second width W2.

In this case, the width in the second direction of the first channel structure 170*a* overlapping the fourth gate structure 180*d* may not vary depending on the position of the first channel structure 170*a*. Since the width in the second direction of the channel of the second buffer multi-bridge transistor TR3*a* does not vary depending on the position of the channel, variation of electrical characteristics generated as the width of the channel in the second direction is changed may not occur.

The separation pattern 190 may be adjacent to the third impurity region structure 150*c* and may extend in the second direction. The separation pattern 190 may be disposed between the impurity region structures to electrically isolate the impurity region structures. In some implementations, the separation pattern 190 may be disposed between the first impurity region structure 150*a* and the third impurity region structure 150*c*. In some implementations, the separation pattern 190 may be disposed between the second impurity region structure 150*b* and the third impurity region structure 150*c*.

In some implementations, one separation pattern 190 and at least one buffer multi-bridge channel transistor TR3*a* and TR3*b* may be formed between the first multi-bridge channel transistor TR1 and the second multi-bridge channel transistor TR2.

The buffer multi-bridge channel transistors TR3*a* and TR3*b* may be disposed adjacent to the separation pattern 190. For example, the separation pattern 190 may be disposed between the first buffer multi-bridge channel transistor TR3*a* and the first multi-bridge channel transistor TR1. For example, the separation pattern 190 may be disposed between the second buffer multi-bridge channel transistor TR3*b* and the second multi-bridge channel transistor TR2.

An insulating interlayer 192 may cover the first to fourth gate structures 180*a*, 180*b*, 180*c* and 180*d* and a sidewall of the separation pattern 190.

As described above, the first multi-bridge channel transistor, the second multi-bridge channel transistor and the buffer multi-bridge channel transistor may have different electrical characteristics.

FIGS. 8 to 22 are plan views, cross-sectional views and perspective views illustrating a method of manufacturing an example of a semiconductor device.

Figure 8:
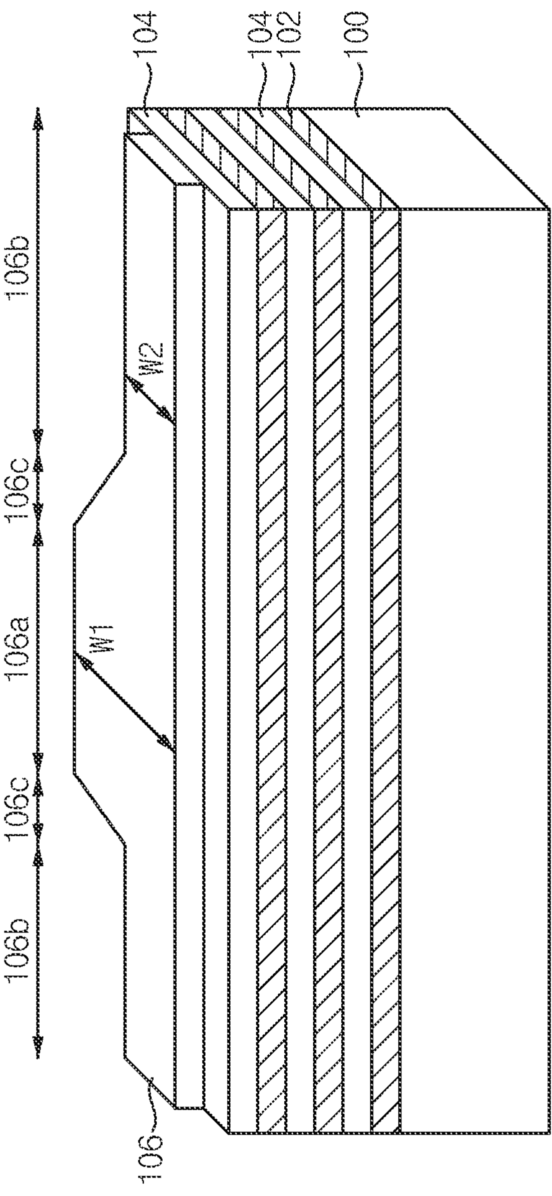
Figure 8:
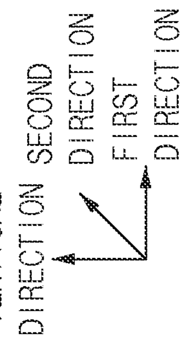

Referring to FIG. 8, a silicon germanium layer 102 and a silicon layer 104 may be alternately and repeatedly stacked on a substrate 100. A mask pattern 106 may be formed on an uppermost silicon layer 104. The substrate 100 may be a single crystal silicon substrate.

The silicon germanium layer 102 and the silicon layer 104 may be formed by a selective epitaxial growth process. The silicon germanium layer 102 may be formed on the substrate 100 by the selective epitaxial growth process using an upper surface of the substrate 100 as a seed.

In some implementations, the silicon layer 104 may be formed by a selective epitaxial growth process using a silicon source gas such as disilane ($Si_2H_6$) gas. The silicon layer 104 may include single crystal silicon.

In some implementations, the silicon germanium layer 102 may be formed by a selective epitaxial growth process using a silicon source gas such as dichlorosilane ($SiH_2Cl_2$) gas, and a germanium source gas such as germanium tetrahydride ($GeH_4$) gas. The silicon germanium layer 102 may include single crystal silicon germanium.

The mask pattern 106 may be formed by a deposition process of a mask layer and a patterning process of the mask layer. The mask pattern 106 may include, e.g., nitride such as silicon nitride. The mask pattern 106 may have a line shape extending in the first direction.

In a plan view, the mask pattern 106 may include a first portion 106*a*, a second portion 106*b* and a third portion 106*c*. The first portion may have a first width W1 in the second direction, and both sidewalls of the first portion in the second direction may have a straight line shape. The second portion 106*b* may have a second width W2 less than the first width W1, and both sidewalls of the second portion in the second direction may have a straight line shape. The third portion 106*c* may be disposed between the first and second portions 106*a* and 106*b*, and at least one of sidewalls of the third portion in the second direction may have a tapered shape. Accordingly, the width of the third portion 106*c* in the second direction may gradually decrease from the first portion 106*a* toward the second portion 106*b*.

Figure 9:
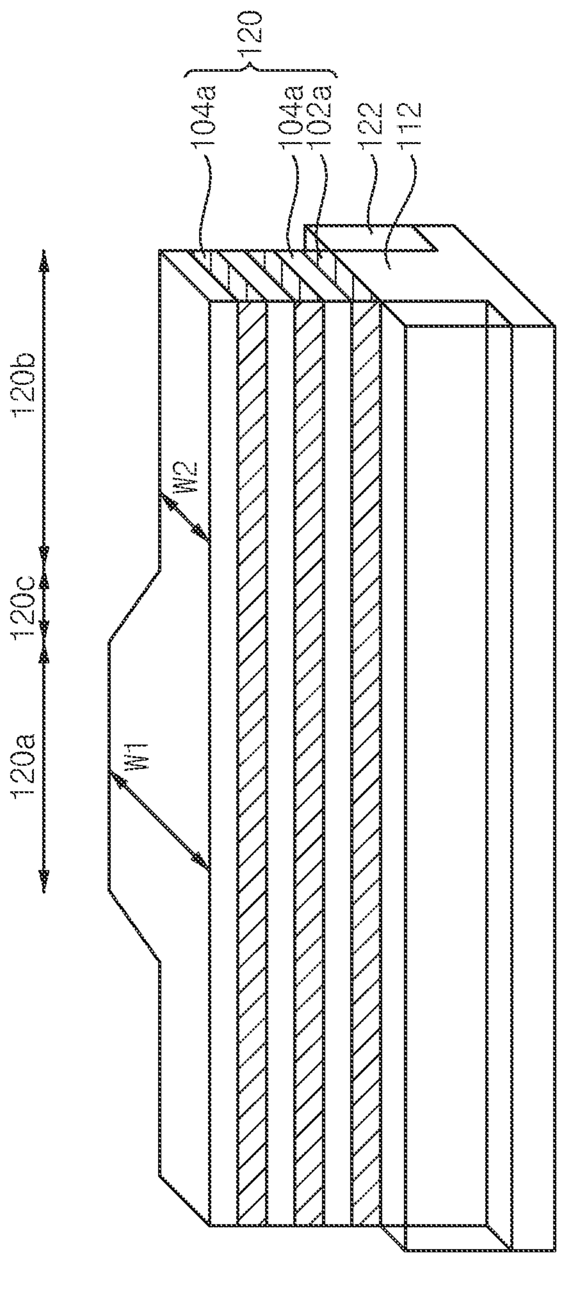
Figure 9:
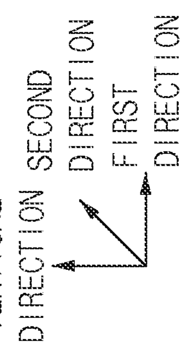
Figure 10:
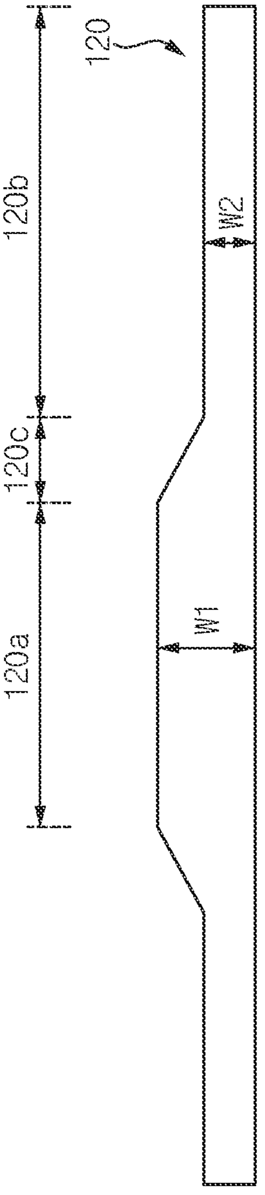

FIGS. 9 and 10, the silicon germanium layers 102, the silicon layers 104 and an upper portion of the substrate 100 may be etched using the mask pattern 106 as an etching mask to form first trenches. The etching process may include an anisotropic etching process.

Accordingly, the substrate 100 may be etched to form an active pattern 112 extending in the first direction. A first fin structure 120 may be formed on the active pattern 112. The first fin structure 120 may include first silicon germanium patterns 102*a* and first silicon patterns 104*a* that are alternately and repeatedly stacked on the active pattern 112. The first fin structure 120 and the mask pattern 106 may be formed on the active pattern 112.

Preferably, a sidewall profile of the first fin structure 120 in the second direction may be a vertical profile. Therefore, the sidewall profile of the first fin structure 120 in the second direction is illustrated as the vertical profile. However, according to characteristics of the anisotropic etching process, the sidewall profile of the first fin structure 120 in the second direction may have an inclined profile such that a width of the first fin structure 120 may be gradually increased to downward.

A device isolation layer may be formed to fill the first trenches. An upper portion of the device isolation layer may be removed, so that the device isolation pattern 122 covering a sidewall of the active pattern 112 may be formed in the first trench. The mask pattern 106 may be removed. The first fin structure 120 may be between the device isolation patterns 122, and may protrude upward from the device isolation patterns 122.

Since the first fin structure 120 is formed by using the mask pattern 106 as the etching mask, in a plan view, the first fin structure 120 may have a shape substantially the same as a shape of the mask pattern 106. Accordingly, in the plan view, the first fin structure 120 may include a first portion 120*a*, a second portion 120*b* and a third portion 120*c*. The first portion 120*a* may have the first width W1 in the second direction and both sidewalls of the first portion 120*a* in the second direction may have a straight line shape. The second portion 120*b* may have the second width W2 less than the first width W1 in the second direction, and both sidewalls of the second portion 120*b* in the second direction may have a straight line shape. The third portion 120*c* may be between the first and second portions 120*a* and 120*b*, and at least one sidewalls of the third portion 120*c* in the second direction may have a tapered shape.

Figure 11:
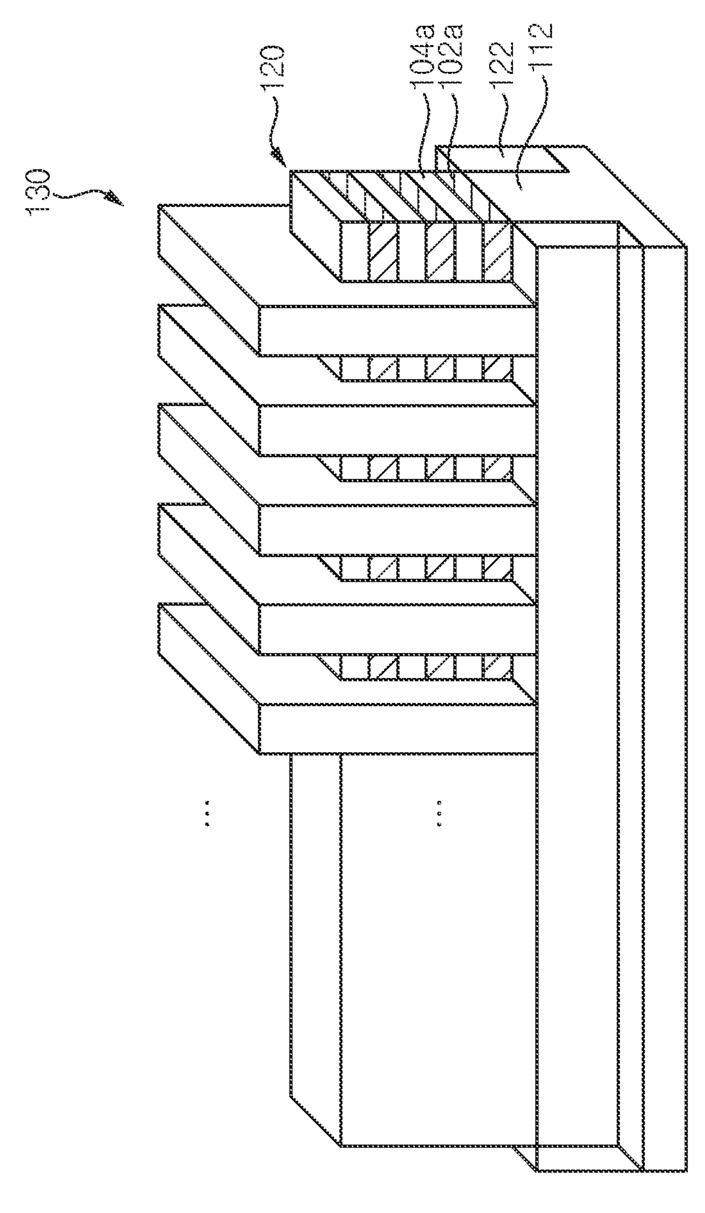
Figure 11:
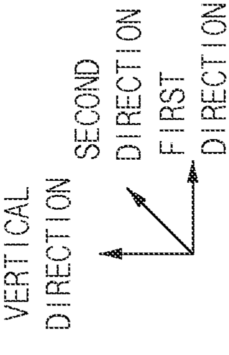
Figure 12:
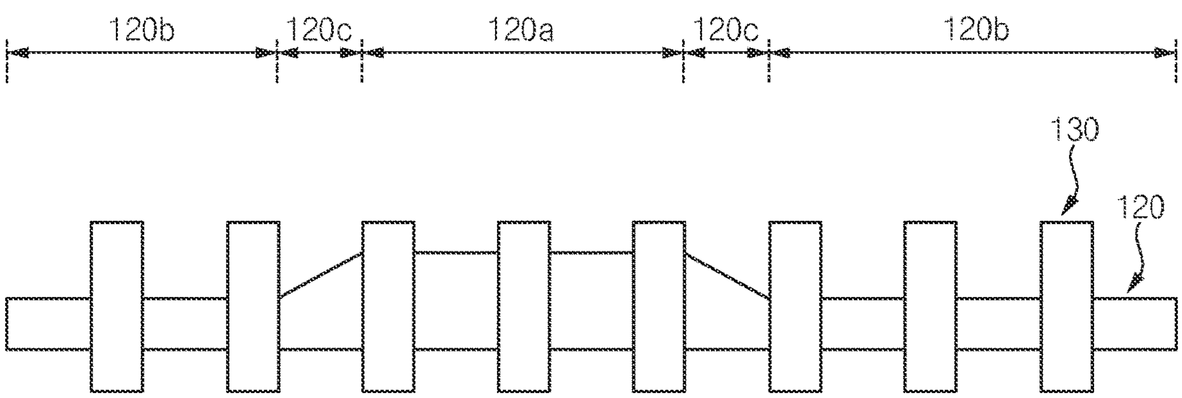
Figure 12:
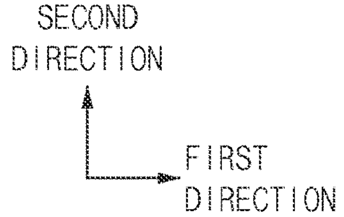

Referring to FIGS. 11 and 12, dummy gate structures 130 may be formed to partially cover the device isolation pattern 122 and the first fin structure 120. The dummy gate structures 130 may extend in the second direction. Accordingly, the dummy gate structures 130 may extend to cross the first fin structure 120. In some implementations, each of the dummy gate structures 130 may have the same width.

The dummy gate structures 130 may be spaced apart from each other in the first direction. In some implementations, the dummy gate structures 130 may be spaced apart from each other at equal spacing in the first direction.

Each of the dummy gate structures 130 may include a dummy gate insulation pattern, a dummy gate electrode, and a dummy gate mask pattern.

A region where the dummy gate structures 130 are formed may be a region where a gate structure of a multi-bridge channel transistor or a diffusion break region is subsequently formed, respectively. A portion of the first fin structure 120 covered by the dummy gate structures 130 may be formed as a channel structure of the multi-bridge channel transistor by subsequent processes. A portion of the first fin structure 120 between the dummy gate structures 130 may be formed as an impurity region structure of the multi-bridge channel transistor by subsequent processes.

In some implementations, the dummy gate structures 130 may be formed to cover a part of the first portion 120*a* of the first fin structure 120 and a part of the second portion 120*b* of the first fin structure 120. In some implementations, the dummy gate structures 130 may not be formed on the third portion 120*c* of the first fin structure 120, and may not cover the third portion 120*c* of the first fin structure 120.

Figure 13:
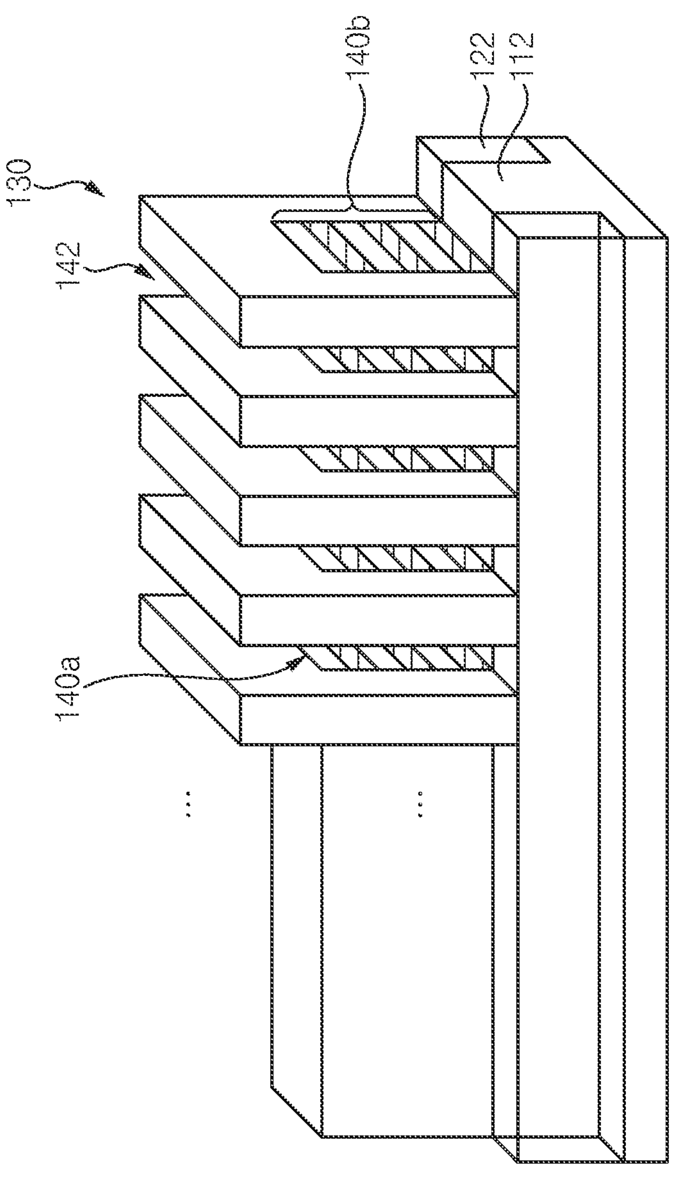
Figure 14:
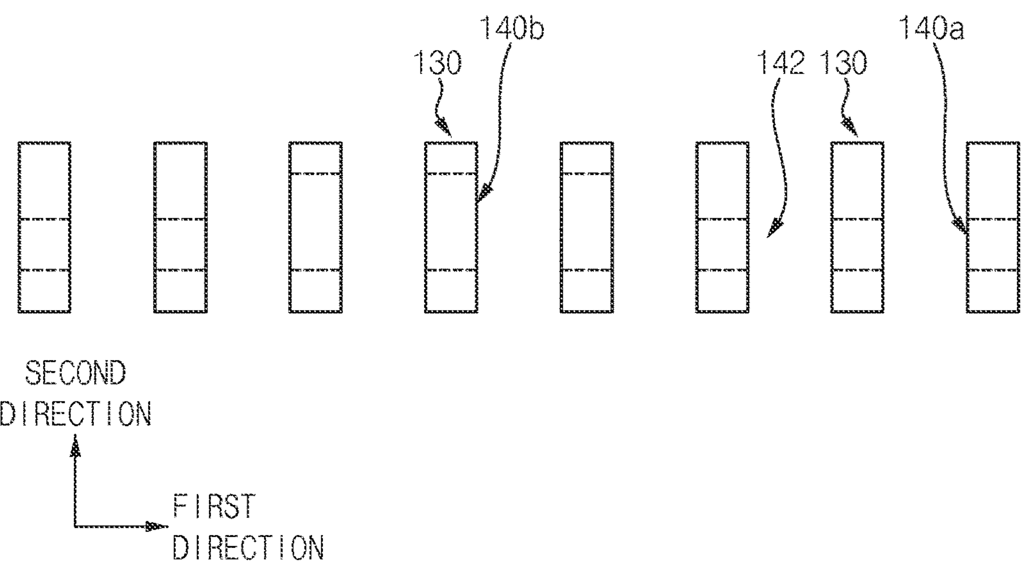

Referring to FIGS. 13 and 14, the first fin structure 120 disposed between the dummy gate structures 130 may be removed to form openings 142. Accordingly, the first fin structure 120 may be cut to form preliminary channel structures 140*a* and 140*b*. The preliminary channel structures 140*a* and 140*b* may be disposed in parallel, and may be spaced apart from each other in the first direction. Each of the preliminary channel structures 140*a* and 140*b* may include a first silicon germanium pattern 102*a* and a first silicon pattern 104*a* alternately and repeatedly stacked.

The preliminary channel structures 140*a* and 140*b* may include a first preliminary channel structure 140*a* having the first width W1 in the second direction and a second preliminary channel structure 140*a* having the second width W2 in the second direction. An active pattern 112 may be exposed by a bottom surface of the opening 142 between the preliminary channel structures 140*a* and 140*b*.

Although not shown, in some implementations, after forming the openings 142, a spacer may be formed on the sidewalls of the dummy gate structures.

Although not shown, in some implementations, after forming the openings 142, a portion of the sidewall of the exposed first silicon germanium pattern 102*a* may be etched to form a recess, and an inner spacer may be further formed in the recess.

Figure 15:
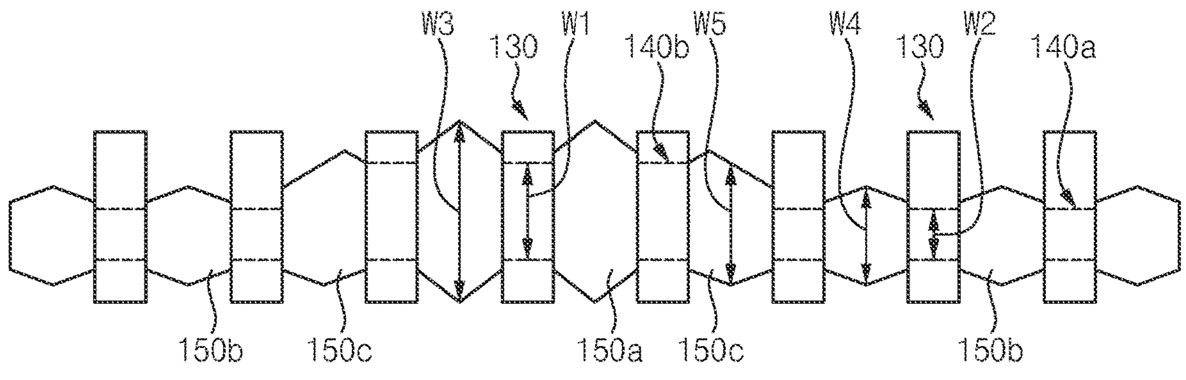
Figure 15:
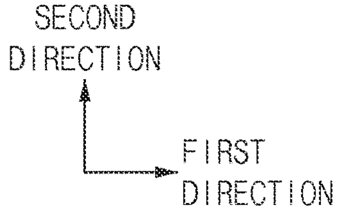

Referring to FIG. 15, a selective epitaxial growth process may be performed at the openings 142 to form impurity region structures 150*a*, 150*b* and 150*c* in the openings 142. The impurity region structures 150*a*, 150*b* and 150*c* may include a semiconductor material.

In some implementations, each of the impurity region structures 150*a*, 150*b* and 150*c* may include single crystal silicon. In some implementations, each of the impurity region structures 150*a*, 150*b* and 150*c* may include single crystal silicon germanium.

In some implementations, impurities may be doped in situ during the selective epitaxial growth process. Accordingly, the impurity region structures 150*a*, 150*b*, and 150*c* may serve as source/drain regions of multi-bridge channel transistors subsequently formed.

In the selective epitaxial growth process, crystal growth may be performed in the vertical direction from the active pattern 112 exposed by the bottom surface of the opening 142. In addition, in the selective epitaxial growth process, crystal growth may be further performed in the second direction. Accordingly, each of the impurity region structures 150*a*, 150*b* and 150*c* may have a polygonal shape in which a center portion protrudes, in a cross-sectional view in the second direction.

The impurity region structures 150*a*, 150*b*, and 150*c* may contact both sidewalls of the preliminary channel structures 140*a* and 140*b* in the first direction, and thus the impurity region structures 150*a*, 150*b*, and 150*c* may be connected with the preliminary channel structures 140*a* and 140*b*.

The impurity region structures may include a first impurity region structure 150*a*, a second impurity region structure 150*b* and a third impurity region structure 150*c*. The first impurity region structure 150*a* may be disposed between the first preliminary channel structures 140*a*. The second impurity region structure 150*b* may be disposed between the second preliminary channel structures 140*b*. The third impurity region structure 150*c* may be disposed between the first and second preliminary channel structures 140*a* and 140*b*.

The first impurity region structure 150*a* may be formed by crystal growth from sidewalls of the first preliminary channel structures 140*a* and the active pattern 112. Therefore, the first impurity region structure 150*a* may have a third width W3 greater than the first width W1 in the second direction. In the plan view, the first impurity region structures 150*a* may have the same first size. The first impurity region structures 150*a* may have the same first volume.

In some implementations, in the plan view, the first impurity region structure 150*a* may be symmetrical to each other with respect to a straight line passing through a center of the first impurity region structure 150*a* in the first direction. In the plan view, the first impurity region structure 150*a* may be symmetrical to each other with respect to a straight line passing through a center of the first impurity region structure 150*a* in the second direction.

The second impurity region structure 150*b* may be formed by crystal growth from sidewalls of the second preliminary channel structures 140*b* and the active pattern 112. Therefore, the maximum width of the second impurity region structure 150*b* in the second direction may be a fourth width W4. The fourth width W4 may be greater than the second width W2, and may be less than the third width W3. The second impurity region structures 150*b* may have a second size smaller than the first size. The second impurity region structures 150*b* may have a second volume smaller than the first volume.

In some implementations, in the plan view, the second impurity region structure 150*b* may be symmetrical to each other with respect to a straight line passing through a center of the second impurity region structure 150*b* in the first direction. In the plan view, the second impurity region structure 150*b* may be symmetrical to each other with respect to a straight line passing through a center of the second impurity region structure 150*b* in the second direction.

A maximum width of the third impurity region structure 150*c* in the second direction may be a fifth width W5. The fifth width W5 may be greater than the fourth width W4, and may be less than the third width W3. In the plan view, the third impurity region structures 150*c* may have a third size smaller than the first size and greater than the second size. The third impurity region structures 150*c* may have a third volume smaller than the first volume and greater than the second volume.

In some implementations, in the plan view, the third impurity region structure 150*c* may be asymmetrical to each other with respect to a straight line passing through a center of the third impurity region structure 150*c* in the first direction. In the plan view, the third impurity region structure 150*c* may be asymmetrical to each other with respect to a straight line passing through a center of third impurity region structure 150*c* in the second direction. In the plan view, in the third impurity region structure 150*b*, a portion grown from the second sidewall having a tapered shape of the third portion of the first active fin and a portion grown from the first sidewall having a straight line shape of the third portion of the first active fin may have different shapes.

Figure 17:
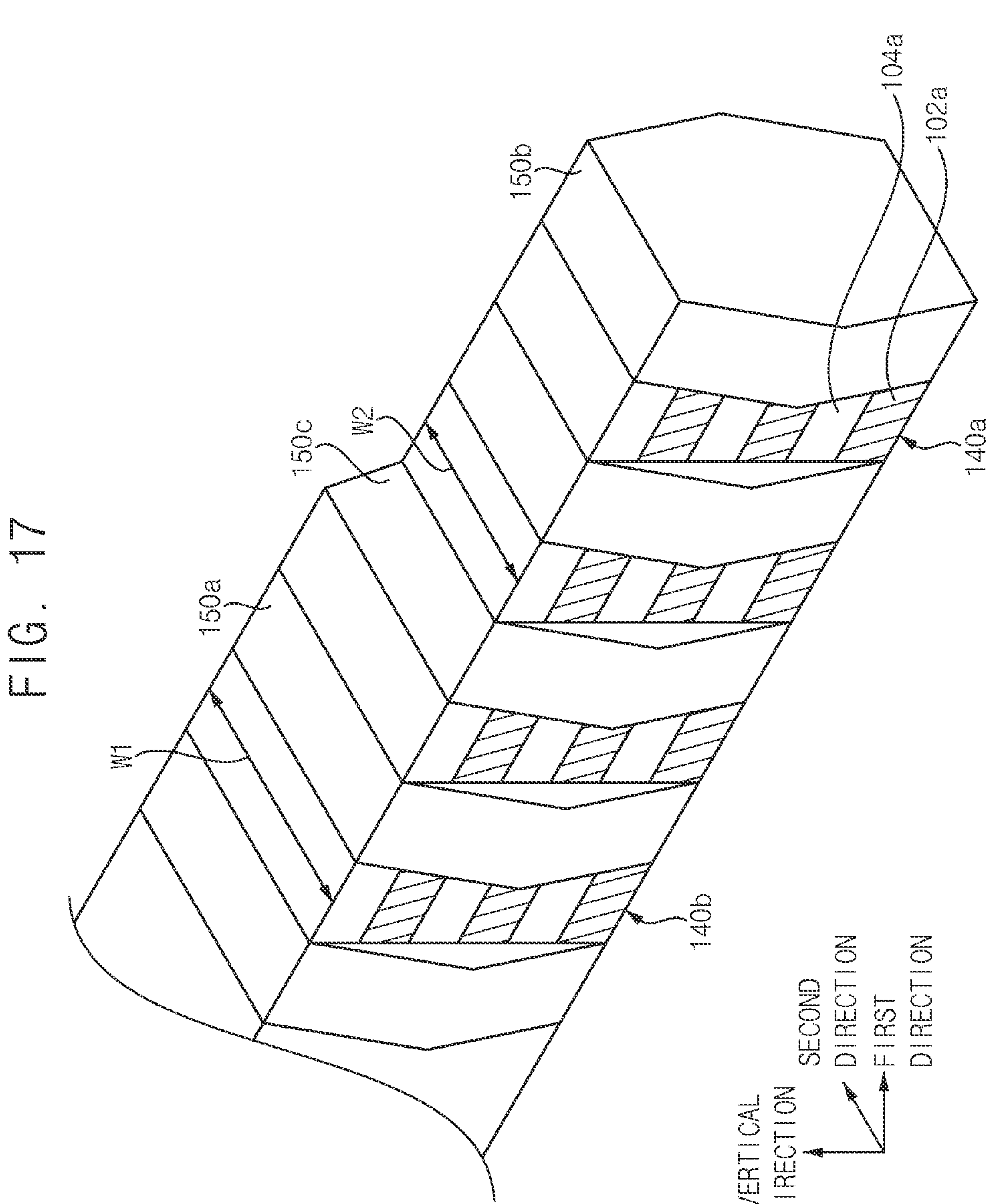
Figure 18:
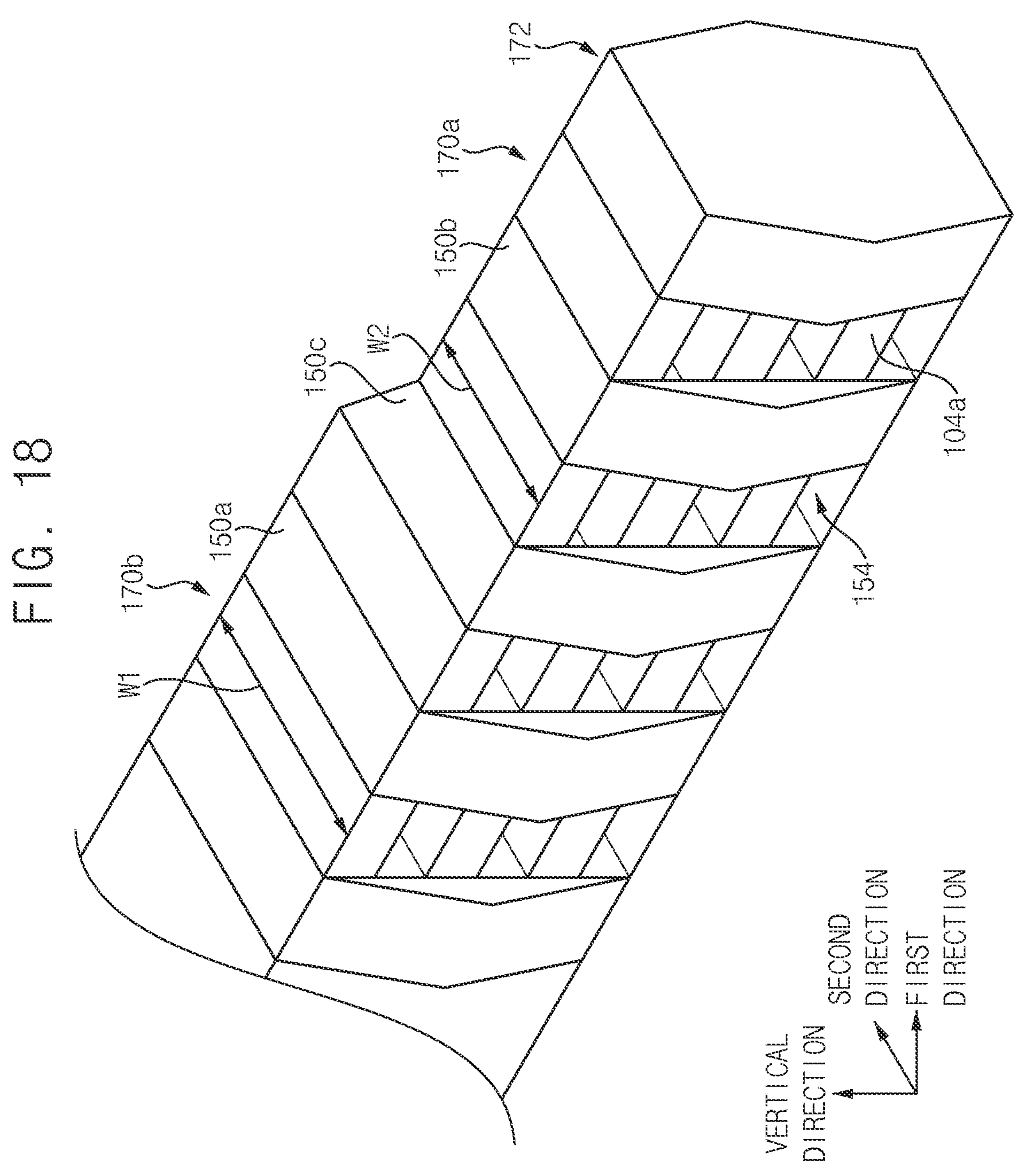

FIG. 17 is a perspective view of the impurity region structure and a first preliminary channel structure. FIG. 18 is a perspective view of the impurity region structure and a channel structure.

Figure 16:
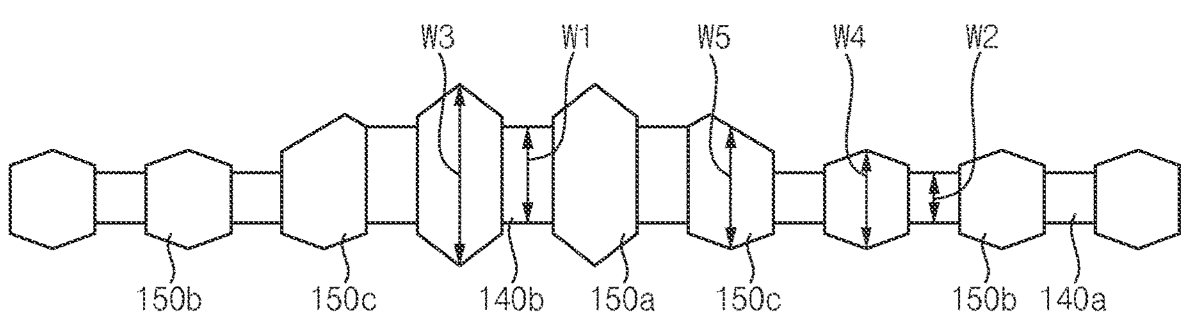
Figure 16:
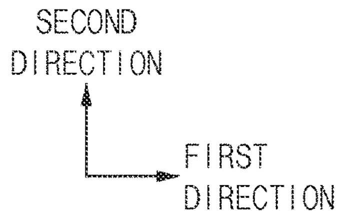

Referring to FIGS. 16 and 17, an insulating interlayer (not shown) may be formed to cover the first to third impurity region structures 150*a*, 150*b* and 150*c*, the device isolation pattern and the dummy gate structure 130. Thereafter, the insulating interlayer may be planarized until a top surface of the dummy gate structure 130 may be exposed.

The dummy gate structures 130 may be removed to form a first gate trench (not shown). The first silicon germanium patterns 102*a* and the first silicon patterns 104*a* in the preliminary channel structures 140*a* and 140*b* may be exposed by the first gate trench.

Referring to FIG. 18, the first silicon germanium patterns 102*a* exposed by the first gate trench may be selectively removed to form gaps 154 between the first silicon patterns 104*a*. The first silicon patterns 104*a* spaced apart from each other in the vertical direction. The first silicon patterns may serve as a channel region of the multi-bridge channel transistor.

As the first silicon germanium pattern 102*a* is removed, the preliminary channel structures 140*a* and 140*b* may be formed as channel structures. The channel structure may include a first channel structure 170*a* having the first width W1 in the second direction and a second channel structure 170*b* having the second width W2 in the second direction.

The channel structure and the impurity region structure may be alternately disposed in the first direction, and may be connected to each other to form the active structure 172. The active structure 172 may include first channel structures 170*a*, second channel structures 170*b*, the first impurity region structure 150*a* between the first channel structures 170*a*, the second impurity region structure 150*b* between the second channel structures 170*b* and the third impurity region structure 150*c* between the first and second channel structures 170*a* and 170*b*.

Figure 19:
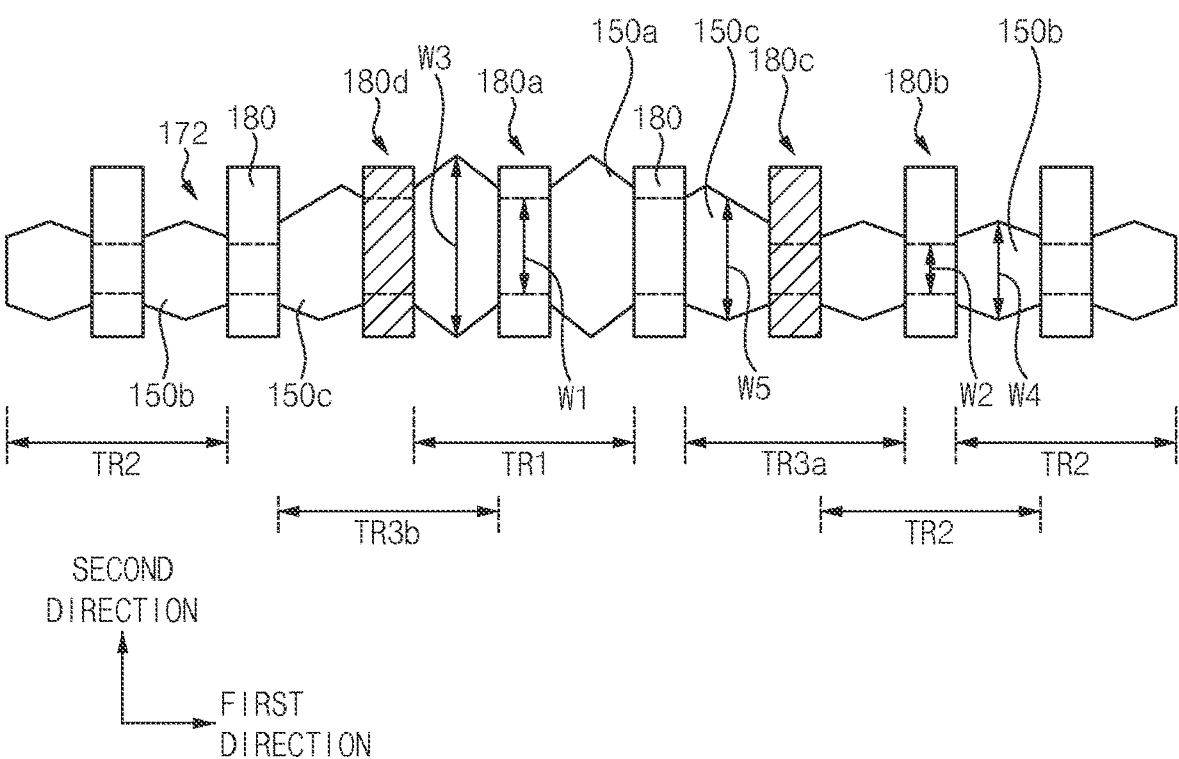
Figure 20:
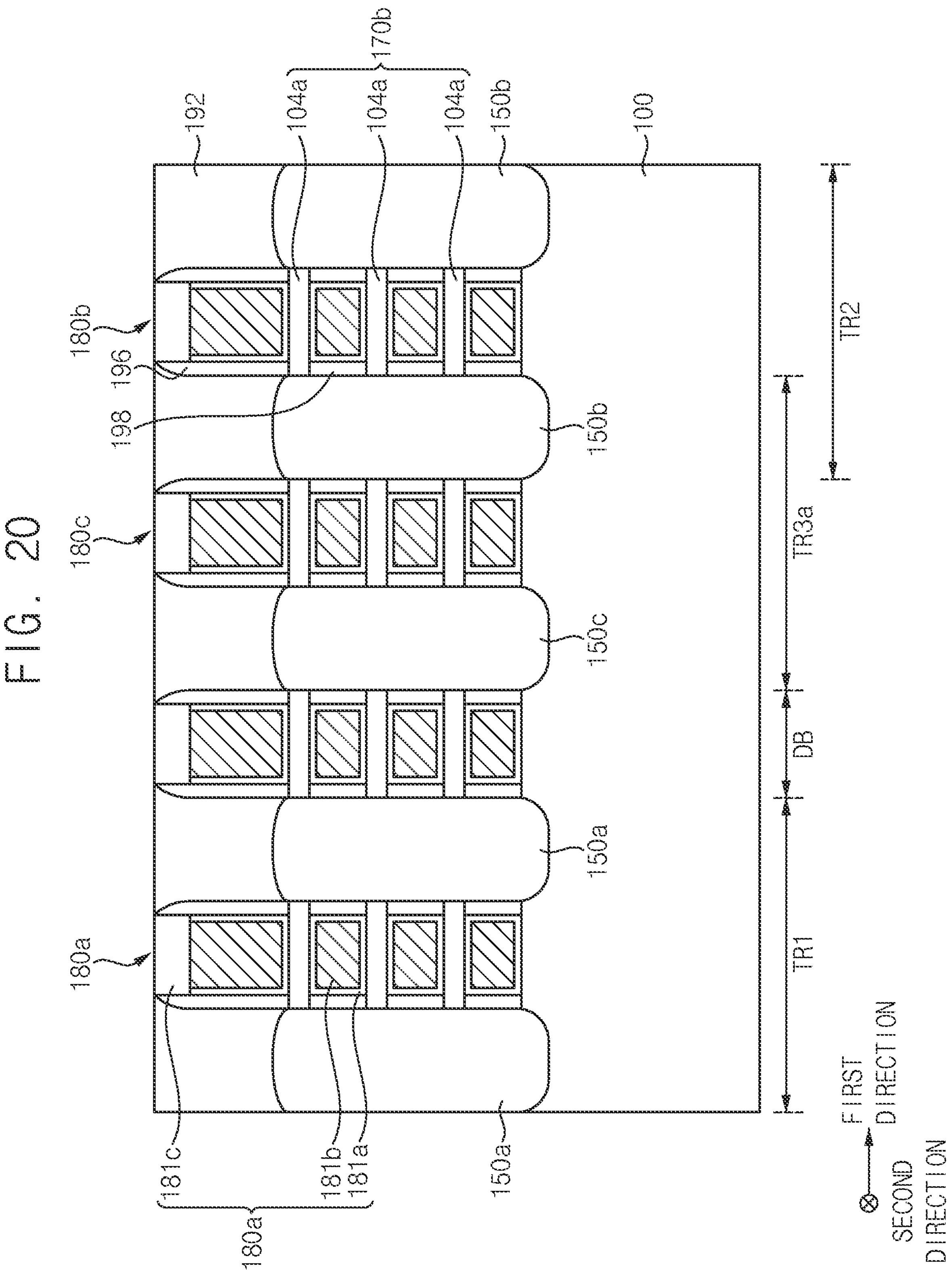

Referring to FIGS. 19 and 20, gate structures 180*a*, 180*b*, 180*c*, 180*d* and 180 may be formed to fill the first gate trench and gaps 154 to form multi-bridge channel transistors.

Particularly, a thermal oxidation process may be performed on surfaces of the active pattern 112 and the first silicon patterns 104*a* exposed by the first gate trench and gaps 154 to form an interface layer. A gate insulation layer may be formed on the interface layer. A gate electrode layer may be formed on the gate insulation layer to fill the first gate trench and the gaps 154. The gate electrode layer may include a metal material. Thereafter, the gate electrode layer and the gate insulating layer may be planarized until an upper surface of the insulating interlayer 192 may be exposed. Upper portions of the gate electrode layer and the gate insulation layer may be removed, and a capping layer pattern may be formed on the remained the gate electrode layer and the gate insulation layer. Accordingly, gate structures 180*a*, 180*b*, 180*c* and 180*d* including an interface pattern (not shown), a gate insulation pattern 181*a*, a gate electrode 181*b*, and a capping pattern 181*c* may be formed.

Each of the multi-bridge channel transistors may include the gate structures 180*a*, 180*b*, 180*c*, and 180*d* and source/drain regions formed in the impurity region structures 150*a*, 150*b*, and 150*c* adjacent to both sides of the gate structures 180*a*, 180*b*, 180*c*, and 180*d*. The multi-bridge channel transistors may be connected to each other in series in the first direction, and may be shared with source/drain regions.

However, the impurity region structures may include first to third impurity region structures 150*a*, 150*b*, and 150*c* having different volumes. Accordingly, the electrical characteristics of each of the multi-bridge channel transistors may vary according to the volumes of the source/drain regions.

Through the above process, a first multi-bridge channel transistor TR1, a second multi-bridge channel transistor TR2, and buffer multi-bridge channel transistors TR3*a* and TR3*b* having different electrical characteristics may be formed.

The first multi-bridge channel transistor TR1 may include a first gate structure 180*a* and first impurity region structures 150*a* adjacent to both sides of the first gate structure 180*a*. The first impurity region structures 150*a* may serve as first source/drain regions of the first multi-bridge channel transistor TR1. The first gate structure 180*a* may extend in the second direction while surrounding the first channel structure 170*a* disposed between the first source/drain regions.

The second multi-bridge channel transistor TR2 may include a second gate structure 180*b* and second impurity region structures 150*b* adjacent to both sides of the second gate structure. The second impurity region structures 150*b* may serve as second source/drain regions of the second multi-bridge channel transistor TR2. The second gate structure 180*b* may extend in the second direction while surrounding the second channel structure 170*b* disposed between the second source/drain regions.

The buffer multi-bridge channel transistors TR3*a* and TR3*b* may include a first buffer multi-bridge channel transistor TR3*a* and a second buffer multi-bridge channel transistor TR3*b*.

The first buffer multi-bridge channel transistor TR3*a* may include a third gate structure 180*c*, the third impurity region structure 150*c* adjacent to one side of the third gate structure 180*c* and the second impurity region structure 150*b* adjacent to the other side of the third gate structure 180*c*. The third impurity region structure 150*c* may serve as a third source region of the first buffer multi-bridge channel transistor TR3*a*. The second impurity region structure 150*b* may serve as a third drain region of the first buffer multi-bridge channel transistor TR3*a*.

The second buffer multi-bridge channel transistor TR3*b* may include a fourth gate structure 180*d*, the third impurity region structure 150*c* adjacent to one side of the fourth gate structure 180*d*, and the first impurity region structure 150*a* adjacent to the other side of the fourth gate structure 180*d*. The third impurity region structure 150*c* may serve as a fourth source region of the second buffer multi-bridge channel transistor TR3*b*. The first impurity region structure 150*a* may serve as a fourth drain region of the second buffer multi-bridge channel transistor TR3*b*.

Figure 21:
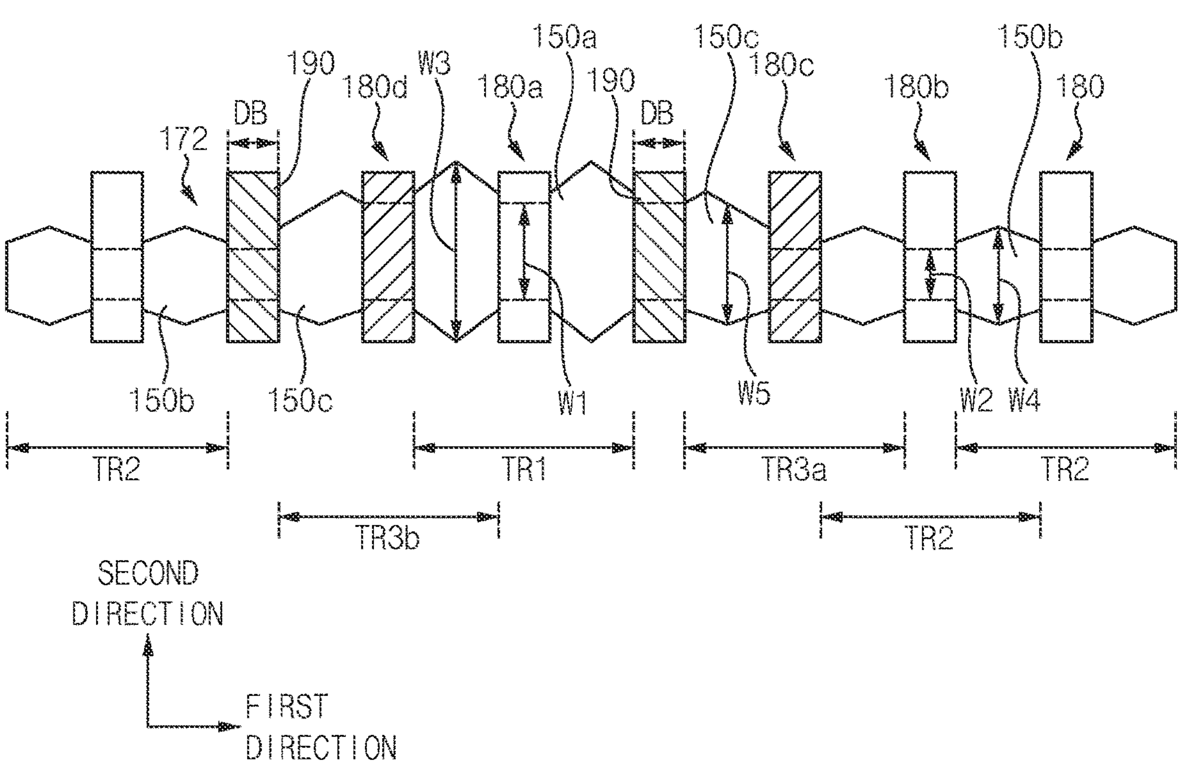
Figure 22:
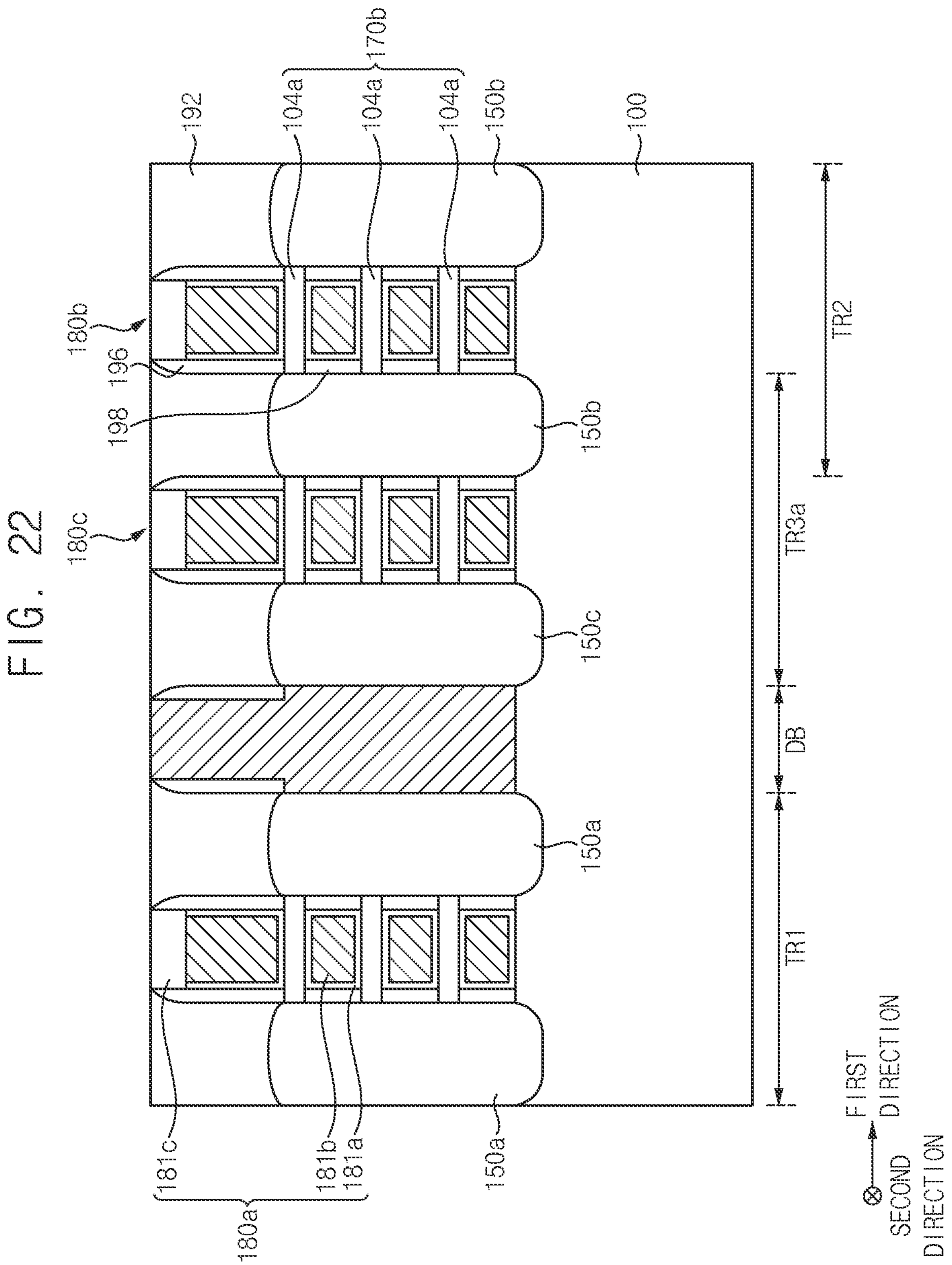

Referring to FIGS. 21 and 22, the gate structure 180 positioned at a diffusion break region DB may be selectively removed. Subsequently, the channel structure exposed by a removed portion of the gate structure 180 may be removed. In this case, the active structure 172 may be cut in the diffusion break region DB.

An insulation material may be formed to fill an opening formed by removing the gate structure 180 and the channel structure in the diffusion break region DB to form a separation pattern 190. The separation pattern 190 may serve as a diffusion break pattern.

The buffer multi-bridge channel transistors TR3*a* and TR3*b* may be adjacent to the separation pattern 190. For example, the separation pattern 190 may be disposed between the first buffer multi-bridge channel transistor TR3*a* and the first multi-bridge channel transistor TR1. Alternatively, the separation pattern 190 may be disposed between the second buffer multi-bridge channel transistor TR3*b* and the second multi-bridge channel transistor TR2.

Through the above processes, a semiconductor device including the first multi-bridge channel transistors TR1, the second multi-bridge channel transistors TR2 and the buffer multi-bridge channel transistors TR3*a* and TR3*b* may be manufactured. The buffer multi-bridge channel transistors TR3*a* and TR3*b* may have an intermediate performance of the first and second multi-bridge channel transistors TR1 and TR2.

Figure 23:
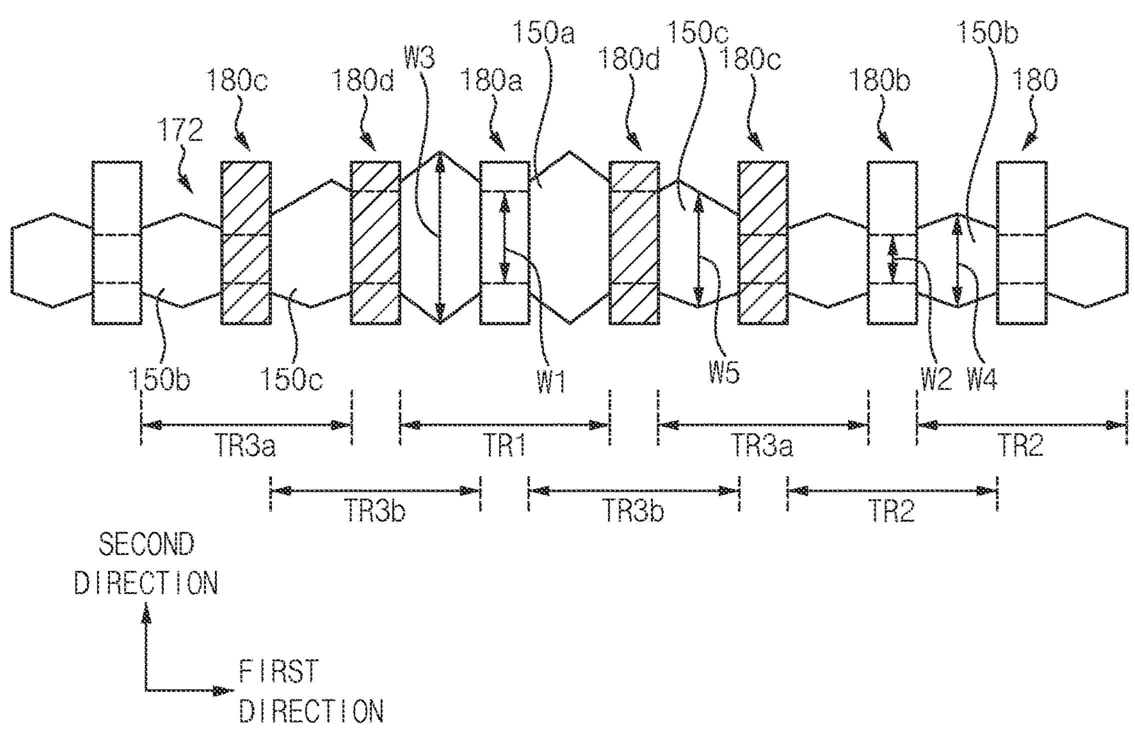
Figure 24:
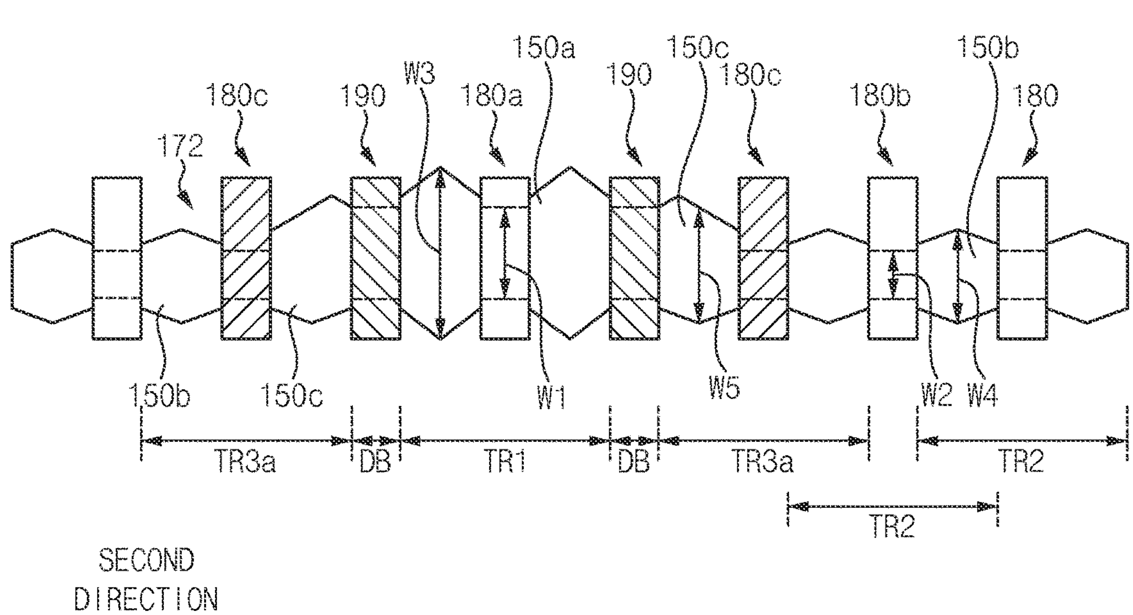
Figure 24:
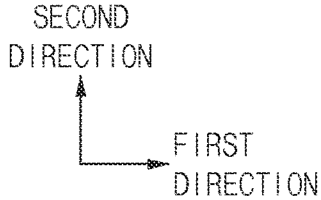
Figure 25:
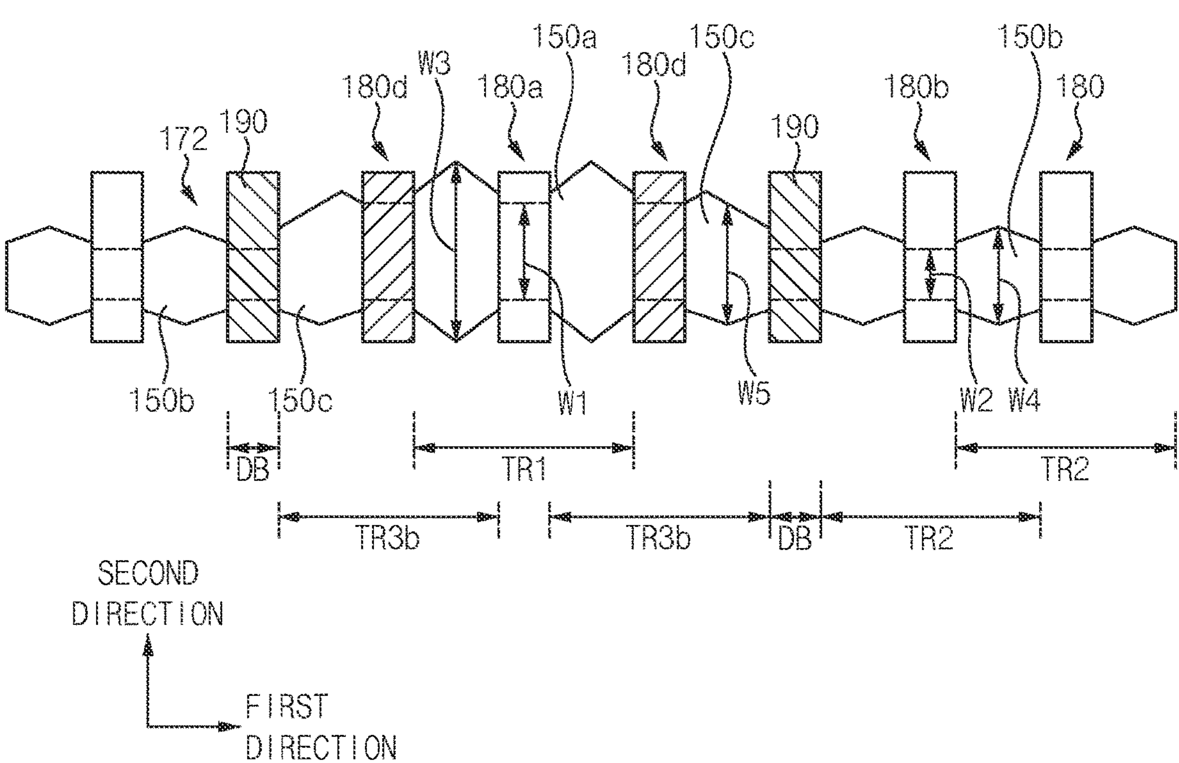

FIGS. 23 to 25 are plan views illustrating examples of semiconductor devices.

The semiconductor devices shown in FIGS. 23 to 25 may be the same as the semiconductor device described with reference to FIGS. 1 to 7, except for presence and absence of the separation pattern and a position of the separation pattern. Therefore, redundant description thereof may be omitted.

Referring to FIG. 23, the active structure may not include a diffusion break region. Accordingly, only buffer multi-bridge channel transistors may be formed between the first and second multi-bridge channel transistors TR1 and TR2.

In some implementations, each of the first and second buffer multi-bridge channel transistors TR3*a* and TR3*b* may be disposed between the first and second multi-bridge channel transistors TR1 and TR2.

In some implementations, the first multi-bridge channel transistor TR2, the second buffer multi-bridge channel transistor TR3*b*, the first buffer multi-bridge channel transistor TR3*a* and the second multi-bridge channel transistor TR2 may be electrically connected to each other.

Referring to FIG. 24, one separation pattern 190 and one first buffer multi-bridge channel transistor TR3*a* may be disposed between the first and second multi-bridge channel transistors TR1 and TR2.

The first buffer multi-bridge channel transistor TR3*a* may include the third gate structure 180*c* surrounding the second channel structure 170*b*, the third impurity region structure 150*c* adjacent to one side of the third gate structure 180*c*, and the second impurity region structure 150*b* adjacent to the other side of the third gate structure 180*c*. The separation pattern 190 may be disposed between the first buffer multi-bridge channel transistor TR3*a* and the first multi-bridge channel transistor TR1.

The second multi-bridge channel transistor TR2 may be electrically connected to the first buffer multi-bridge channel transistor TR3*a*.

Referring to FIG. 25, one separation pattern 190 and one second buffer multi-bridge channel transistor TR3*b* may be disposed between the first and second multi-bridge channel transistors TR1 and TR2.

The second buffer multi-bridge channel transistor TR3*b* may include the fourth gate structure 180*d*, the third impurity region structure 150*c* adjacent to one side of the fourth gate structure 180*d*, and the first impurity region structure 150*a* adjacent to the other side of the fourth gate structure 180*d*. The third impurity region structure 150*c* may serve as a fourth source region of the second buffer multi-bridge channel transistor TR3*b*. The separation pattern 190 may be disposed between the second buffer multi-bridge channel transistor TR3*b* and the second multi-bridge channel transistor TR2.

The first multi-bridge channel transistor TR1 may be electrically connected to the second buffer multi-bridge channel transistor TR3*b*.

Figure 26:
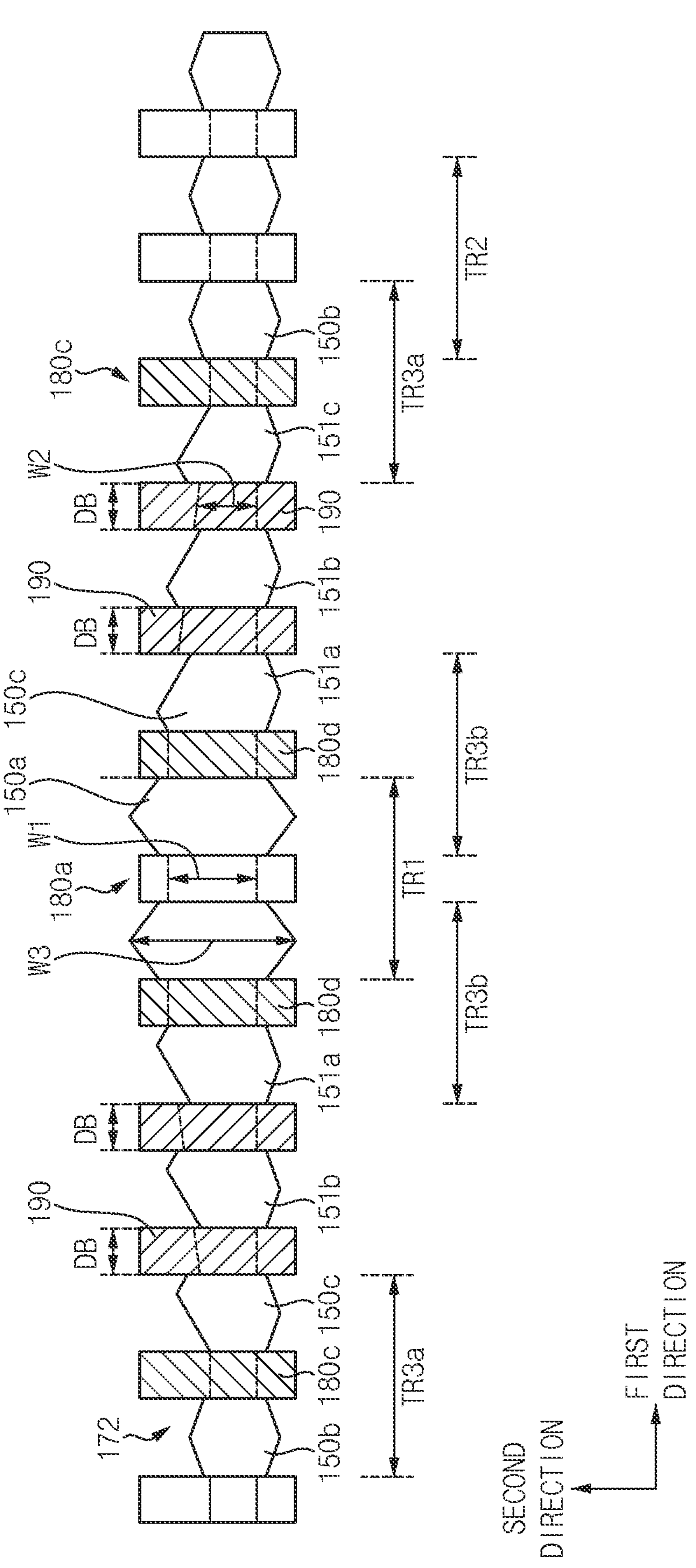

FIG. 26 is a plan view illustrating an example of a semiconductor device.

The semiconductor device shown in FIG. 26 may be the same as the semiconductor device described with reference to FIGS. 1 to 7, except for a plurality of separation patterns. Therefore, redundant description thereof may be omitted.

Referring to FIG. 26, a plurality of separation patterns 190 and at least one buffer multi-bridge channel transistor TR3*a* and TR3*b* may be disposed between the first and second multi-bridge channel transistors TR1 and TR2.

In a region between the first and second multi-bridge channel transistors TR1 and TR2, the second buffer multi-bridge channel transistor TR3*b* may be disposed adjacent to the first multi-bridge channel transistor TR1 positioned at an end in a region of the first multi-bridge channel transistors TR1.

In the region between the first and second multi-bridge channel transistors TR1 and TR2, a first buffer multi-bridge channel transistor TR3*a* may be disposed adjacent to the second multi-bridge channel transistor TR2.

In addition, in the region between the first and second multi-bridge channel transistors TR1 and TR2, the plurality of separation patterns 190 may be formed between the buffer multi-bridge channel transistors. The impurity region structures 151*a*, 151*b* and 151*c* adjacent to both sides of each of the separation patterns 190 may have different volumes. The volumes of the impurity region structures 151*a*, 151*b*, and 151*c* adjacent to both sides of each of separation patterns 190 may be gradually decreased from a region formed the first multi-bridge channel transistor TR3*a* toward a region formed the second multi-bridge channel transistor TR3*b*.

The foregoing is illustrative of example implementations and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:

a plurality of first channel structures on a substrate, the first channel structures spaced apart from each other in a first direction parallel to a surface of the substrate, each of the first channel structure having a first width in a second direction parallel to the surface of the substrate and perpendicular to the first direction, and including silicon patterns spaced apart from each other in a vertical direction;

a plurality of second channel structures on the substrate, the second channel structures spaced apart from each other in the first direction, each of the second channel structure having a second width in the second direction less than the first width, and including silicon patterns spaced apart from each other in the vertical direction;

a first impurity region structure between the first channel structures, the first impurity region structure connecting sidewalls of adjacent first channel structures, and having a first volume;

a second impurity region structure between second channel structures, the second impurity region structure connecting sidewalls of adjacent second channel structures, and having a second volume smaller than the first volume;

a third impurity region structure between the first and second channel structures, the third impurity region structure connecting sidewalls of adjacent first and second channel structures, and having a third volume smaller than the first volume and greater than the second volume; and a plurality of gate structures disposed between the first to third impurity region structures, respectively, each of the gate structure covering one of the first and second channel structures, and extending in the second direction.

2. The semiconductor device of claim 1, wherein a maximum width of the first impurity region structure in the second direction is a third width greater than the first width, and a maximum width of the second impurity region structure in the second direction is a fourth width greater than the second width and less than the third width.

3. The semiconductor device of claim 2, wherein a maximum width of the third impurity region structure in the second direction is a fifth width less than the third width and greater than the fourth width.

4. The semiconductor device of claim 1, wherein each of the first to third impurity region structures has the same width in the first direction.

5. The semiconductor device of claim 1, further comprising:

first buffer gate structures covering the second channel structure between the second and third impurity region structures for serving as a gate of a first buffer transistor; and second buffer gate structures covering the first channel structure between the first and third impurity region structure for serving as a gate of a second buffer transistor.

6. The semiconductor device of claim 1, further comprising:

first buffer gate structures covering the second channel structure between the second and third impurity region structures for serving as a gate of a first buffer transistor; and a first separation pattern between the first and third impurity region structures adjacent to the first buffer gate structures.

7. The semiconductor device of claim 1, further comprising:

second buffer gate structures covering the first channel structure between the first and third impurity region structures for serving as a gate of a second buffer transistor; and a second separation pattern between the second and third impurity region structures adjacent to the second buffer gate structure.

8. The semiconductor device of claim 1, wherein the first impurity region structure protrudes in a second direction from a sidewall of an adjacent first channel structure, the second impurity region structure protrudes from a sidewall of an adjacent second channel structure, and the third impurity region structures protrude in the second direction from sidewalls of each of the adjacent first and second channel structures.

9. The semiconductor device of claim 1, wherein the first to third impurity region structures include a semiconductor material.

10. The semiconductor device of claim 1, wherein, in a plan view, the third impurity region structure is asymmetrical with respect to a straight line passing through a center thereof in the first direction.

11. The semiconductor device of claim 1, wherein, in a plan view, the third impurity region structure is asymmetric with respect to a straight line passing through a center thereof in the second direction.

12. The semiconductor device of claim 1, wherein, in a plan view, each of the first and second impurity region structures is symmetrical with respect to a straight line passing through a center thereof in the first direction.

13. A semiconductor device, comprising:

a first transistor on a substrate, the first transistor including a first channel structure having a first width in a second direction parallel to a surface of the substrate, a first gate structure extending in the second direction and parallel to the surface of the substrate to cover the first channel structure, and a first impurity region structure on both sides of the first gate structure in a first direction perpendicular to the second direction, wherein the first impurity region structure is connected to the first channel structure, and have a first volume;

a second transistor on the substrate, the second transistor including a second channel structure having a second width in the second direction less than the first width, a second gate structure extending in the second direction to cover the second channel structure, and a second impurity region structure on both sides of the second gate structure in the first direction, wherein the second impurity region structure is connected to the second channel structure, and has a second volume smaller than the first volume; and a buffer transistor on the substrate, the buffer transistor including a third channel structure between the first and second transistors, a third gate structure extending in the second direction to cover the third channel structure, a third impurity region structure on a side of the third gate structure in the first direction connected to the third channel structure, and a fourth impurity region structure on another side of the third gate structure connected to the third channel structure, wherein the fourth impurity region structure has a volume different from a volume of the third impurity region structure.

14. The semiconductor device of claim 13, wherein the third impurity region structure and the first impurity region structure are shared with each other to serve as a single impurity region structure, and the fourth impurity region structure has a third volume smaller than the first volume and greater than the second volume.

15. The semiconductor device of claim 14, further comprising a separation pattern between the fourth impurity region structure and the second impurity region structure.

16. The semiconductor device of claim 13, wherein the third impurity region structure and the second impurity region structure are shared with each other to serve as a single impurity region structure, and the fourth impurity region structure has a third volume smaller than the first volume and greater than the second volume.

17. The semiconductor device of claim 16, further comprising a separation pattern between the fourth impurity region structure and the first impurity region structure.

18. The semiconductor device of claim 13, wherein each of the first to third channel structures includes silicon patterns spaced apart from each other in a vertical direction perpendicular to the surface of the substrate, and each of the first to third gate structures extends to fill a gap between the silicon patterns.

19. The semiconductor device of claim 13, wherein the buffer transistor is electrically connected to at least one of the first transistor and the second transistor.

20. A semiconductor device, comprising:

a first transistor including a first channel structure on a substrate, a first gate structure extending in a second direction parallel to a surface of the substrate to cover the first channel structure, and a first impurity region structure on both sides of the first gate structure in a first direction perpendicular to the second direction, wherein the first impurity region structure is connected to the first channel structure, and has a first volume;

a second transistor including a second channel structure on a substrate, a second gate structure extending in the second direction to cover the second channel structure, and a second impurity region structure on both sides of the second gate structure in the first direction, wherein the second impurity region structure is connected to the second channel structure, and has a second volume smaller than the first volume; and a buffer transistor including a third channel structure on the substrate, a third gate structure extending in the second direction to cover the third channel structure, and a third impurity region structure on a side of the third gate structure in the first direction to be connected with the third channel structure, wherein the third impurity region structure has a third volume different from the first volume of the first impurity region structure and the second volume of the second impurity region structure, and wherein the first impurity region structure contacts the other side of the third gate structure in the first direction.

* * * * *